(12) United States Patent
Lee et al.

(10) Patent No.: US 12,302,631 B2
(45) Date of Patent: May 13, 2025

(54) SEMICONDUCTOR DEVICE AND METHOD FOR FORMING THE SAME

(71) Applicant: TAIWAN SEMICONDUCTOR MANUFACTURING COMPANY, LTD., Hsinchu (TW)

(72) Inventors: Kun-Yu Lee, Tainan (TW); Chun-Yao Wang, Hsinchu County (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/429,734

(22) Filed: Feb. 1, 2024

(65) Prior Publication Data
US 2024/0170485 A1  May 23, 2024

Related U.S. Application Data

(62) Division of application No. 17/395,827, filed on Aug. 6, 2021, now Pat. No. 11,923,360.

(51) Int. Cl.
| | | |
|---|---|---|
| H01L 27/088 | (2006.01) | |
| H01L 21/02 | (2006.01) | |
| H01L 21/8234 | (2006.01) | |
| H01L 29/06 | (2006.01) | |
| H01L 29/66 | (2006.01) | |
| H01L 29/78 | (2006.01) | |
| H10D 30/01 | (2025.01) | |
| H10D 30/62 | (2025.01) | |

(Continued)

(52) U.S. Cl.
CPC ..... *H10D 84/834* (2025.01); *H01L 21/02164* (2013.01); *H10D 30/0243* (2025.01); *H10D 30/6211* (2025.01); *H10D 62/115* (2025.01); *H10D 84/0158* (2025.01); *H10D 84/038* (2025.01)

(58) Field of Classification Search
CPC .......... H01L 27/0886; H01L 21/02164; H01L 21/823431; H01L 29/0649; H01L 29/6681; H01L 29/7851
See application file for complete search history.

(56) References Cited

U.S. PATENT DOCUMENTS

2016/0155748 A1 * 6/2016 Li ............... H01L 29/7883
257/295
2021/0242206 A1 * 8/2021 Lin ............... H01L 27/0886

* cited by examiner

*Primary Examiner* — Christine A Enad
(74) *Attorney, Agent, or Firm* — Birch, Stewart, Kolasch & Birch, LLP

(57) ABSTRACT

A semiconductor device includes a substrate, a pair of semiconductor fins, a dummy fin structure, a gate structure, a plurality of source/drain structures, a crystalline hard mask layer, and an amorphous hard mask layer. The pair of semiconductor fins extend upwardly from the substrate. The dummy fin structure extends upwardly above the substrate and is laterally between the pair of semiconductor fins. The gate structure extends across the pair of semiconductor fins and the dummy fin structure. The source/drain structures are above the pair of semiconductor fins and on either side of the gate structure. The crystalline hard mask layer extends upwardly from the dummy fin and has a U-shaped cross section. The amorphous hard mask layer is in the first hard mask layer, wherein the amorphous hard mask layer having an U-shaped cross section conformal to the U-shaped cross section of the crystalline hard mask layer.

20 Claims, 27 Drawing Sheets

(51) Int. Cl.
*H10D 62/10* (2025.01)
*H10D 84/01* (2025.01)
*H10D 84/03* (2025.01)
*H10D 84/83* (2025.01)

C-C'

SEMICONDUCTOR DEVICE AND METHOD FOR FORMING THE SAME

PRIORITY CLAIM AND CROSS-REFERENCE

The present application is a Divisional application of the U.S. application Ser. No. 17/395,827, filed on Aug. 6, 2021, which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
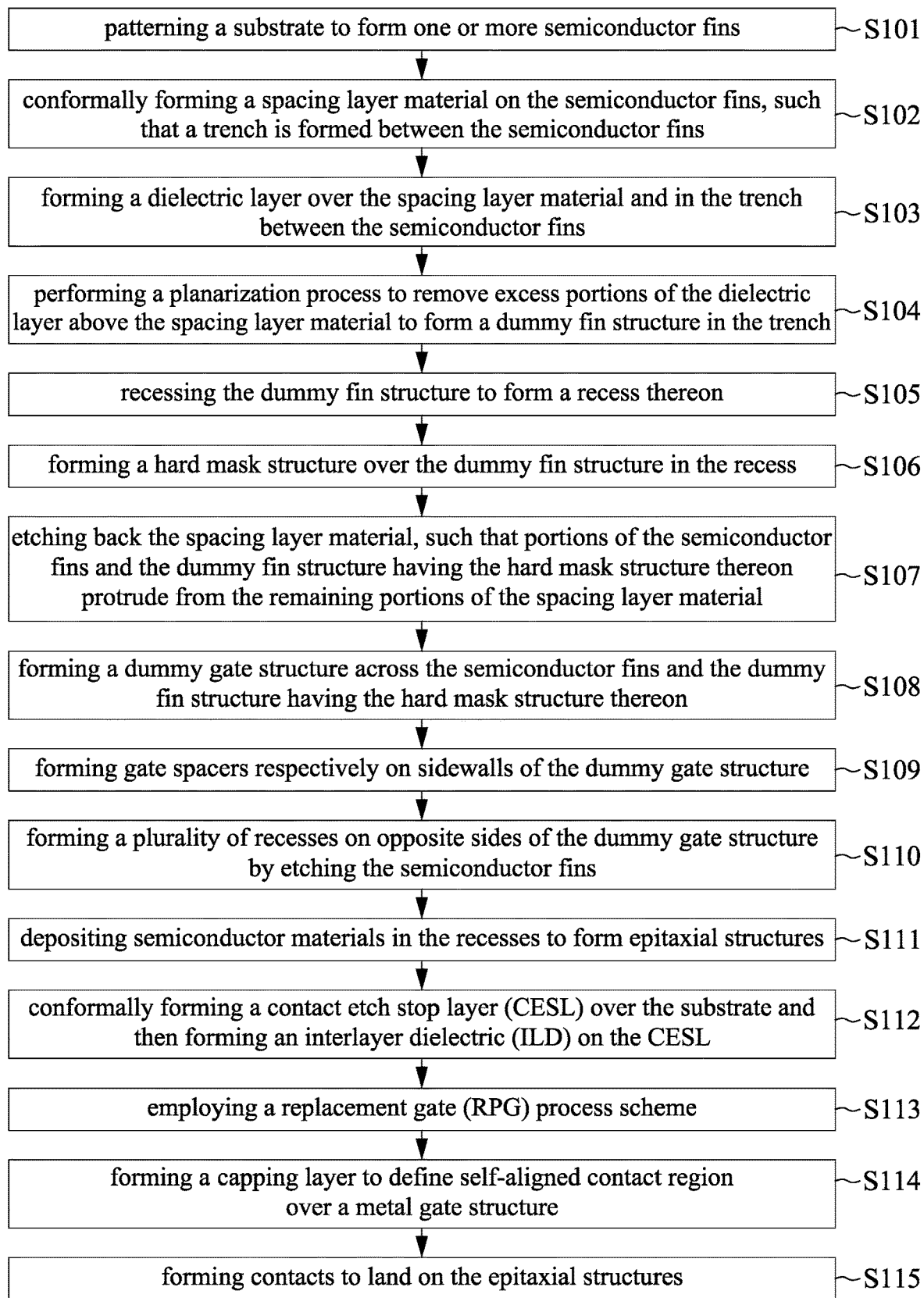
FIG. 1 illustrates a block diagram of a method of forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present disclosure are directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The fins may be patterned by any suitable method. For example, the fins may be patterned using one or more photolithography processes, including double-patterning or multi-patterning processes. The double-patterning or the multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Referring now to FIG. 1, illustrated are an exemplary method M for fabrication of a semiconductor device in accordance with some embodiments. The method M includes a relevant part of the entire manufacturing process. It is understood that additional operations may be provided before, during, and after the operations shown by FIG. 1, and some of the operations described below can be replaced or eliminated for additional embodiments of the method. The order of the operations/processes may be interchangeable. The method M includes fabrication of a FinFET device. However, the fabrication of FinFET device is merely example for describing the manufacturing process according to some embodiments of the present disclosure.

Figure 2:
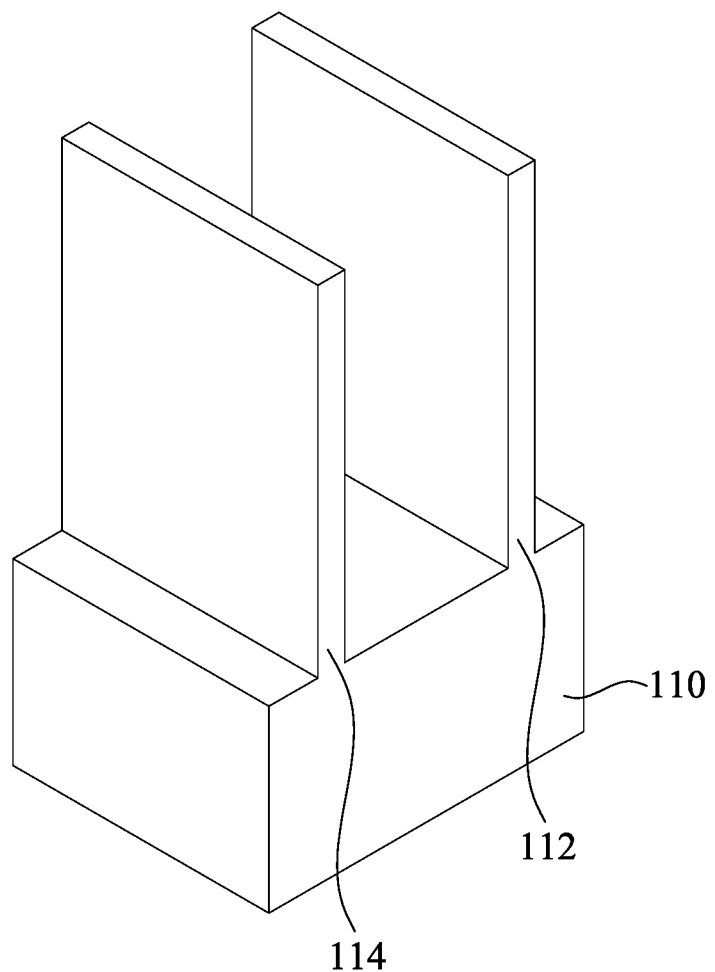
FIGS. 2-6, 7A, 8A, 9A, 10A, 11A, 12-19, and 20A illustrate a semiconductor device at various stages of the method in FIG. 1 according to some embodiments of the present disclosure.

FIGS. 2-20C illustrate a semiconductor device 100 at various stages of the method M according to some embodiments of the present disclosure. The method M begins at block S101. Referring to FIG. 2, in some embodiments of block S101, a substrate 110 is provided. The substrate 110 includes at least one N-type region and at least one P-type region. At least one N-type device will be formed on the N-type region, and at least one P-type device will be formed on the P-type region. For ease of explanation, it is assumed that in FIGS. 1-20C, the substrate 110 includes one N-type region and one P-type region adjacent the N-type region. In some embodiments, the substrate 110 may include silicon (Si). Alternatively, the substrate 110 may include germanium (Ge), silicon germanium (SiGe), gallium arsenide (GaAs) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 110 may include any of a variety of substrate structures and materials.

A plurality of semiconductor fins 112 and 114 are respectively formed over the N-type region and the P-type region of the substrate 110. The semiconductor fins 112 and 114 may serve as active regions (e.g., channels and source/drain features) of transistors. It is noted that the numbers of the semiconductor fins 112 and 114 in FIG. 1 are illustrative, and should not limit the claimed scope of the S101 present disclosure. In addition, one or more dummy fins may be disposed adjacent both sides of the semiconductor fins 112 and/or 114 to improve pattern fidelity in patterning processes.

The semiconductor fins 112 and 114 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the semiconductor fins 112 and 114 in this case) and developed to remove a portion of the photoresist material. The remaining photoresist material protects the underlying material from subsequent processing operations, such as etching. It should be noted that other masks, such as an oxide or silicon nitride mask, may also be used in the etching process. The semiconductor fins 112 and 114 may be made of the same material as the substrate 110 and may continuously extend or protrude from the substrate 110. The semiconductor fins 112 and 114 may be intrinsic, or appropriately doped with an n-type impurity or a p-type impurity.

In some other embodiments, the semiconductor fins 112 and 114 may be epitaxially grown. For example, exposed portions of an underlying material, such as an exposed portion of the substrate 110, may be used in an epitaxial process to form the semiconductor fins 112 and 114. A mask may be used to control the shape of the semiconductor fins 112 and 114 during the epitaxial growth process.

Figure 3:
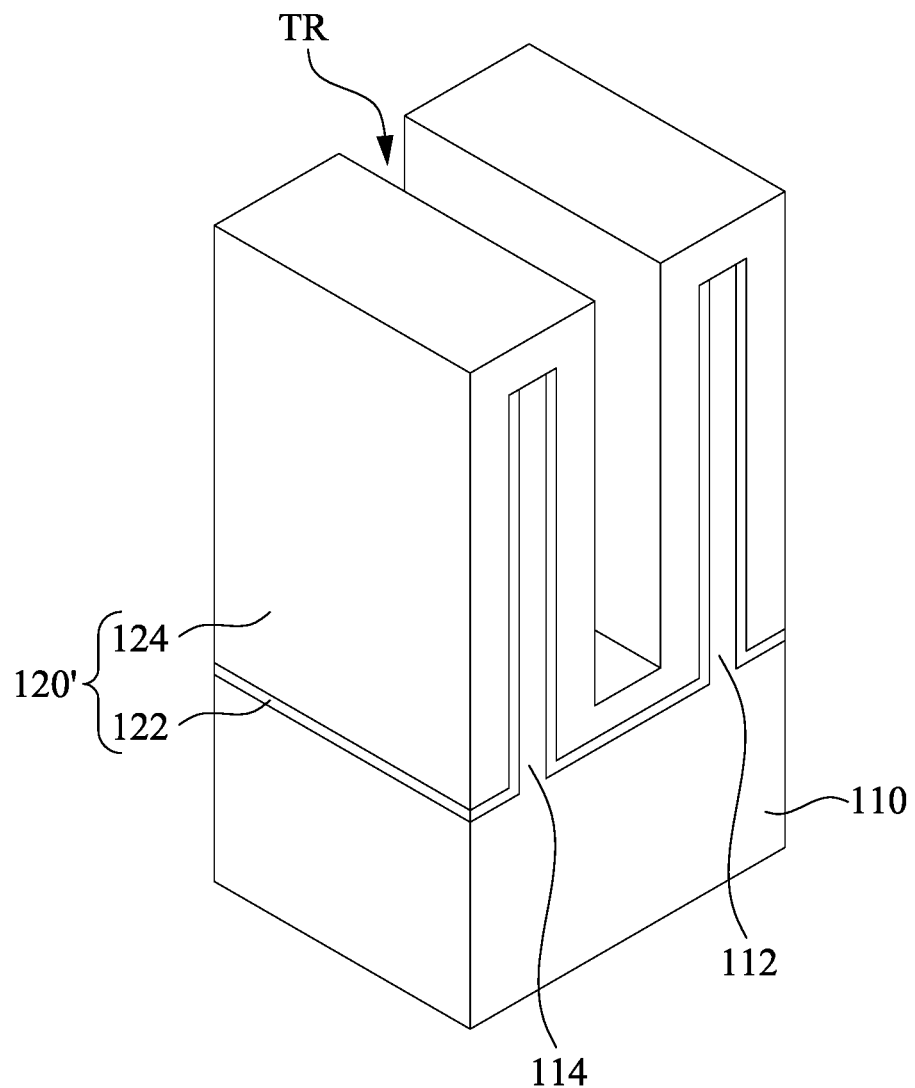

Returning to FIG. 1, the method M then proceeds to block S102 where a spacing layer material is blanketed on the semiconductor fins, such that a trench is formed between the semiconductor fins. With reference to FIG. 3, in some embodiments of block S102, a spacing layer material 120' is deposited on the semiconductor fins 112 and 114, such that a trench TR is formed between the semiconductor fins 112 and 114. In some embodiments, the spacing layer material 120' can be made of dielectric materials. In some embodiments, the spacing layer material 120' may be made of a dielectric material such as, for example, spin-on-glass, silicon nitride, silicon oxynitride, FSG, a low-k dielectric material, and/or other suitable insulating material. In some embodiments, the spacing layer material 120' is deposited by an ALD process. In some embodiments, the deposition of the spacing layer material 120' can be done by suitable processes such as, for example, plasma-enhanced ALD (PEALD), CVD, PVD, molecular beam epitaxy (MBE), high density plasma CVD (HDPCVD), metal organic (MOCVD), remote plasma CVD (RPCVD), PECVD, other suitable methods, and/or combinations thereof. The spacing layer material 120' can be deposited between the semiconductor fins 112 and 114 to form openings 128, in accordance with some embodiments. By choosing suitable processing deposition parameters, the openings 128 may be configured to create spaces for the subsequent deposition of self-aligned isolation fins.

In some embodiments, the spacing layer material 120' includes a first liner layer 122 and a second liner layer 124. The first liner layer 122 is in contact with the substrate 110 and may be a dielectric layer, such as silicon oxide, silicon nitride, silicon oxynitride, SiCN, $SiC_xO_yN_z$, or combinations thereof. The second liner layer 124 is on and in contact with the first liner layer 122 and may be a dielectric layer, such as silicon oxide, silicon nitride, silicon oxynitride, SiCN, $SiC_xO_yN_z$, or combinations thereof. The first liner layer 122 and the second liner layer 124 have different materials. For example, the first liner layer 122 is a nitride layer, and the second liner layer 124 is an oxide layer. In some embodiments, the first liner layer 122 is omitted. In some embodiments, the second liner layer 124 is thicker than the first liner layer 122.

Figure 4:
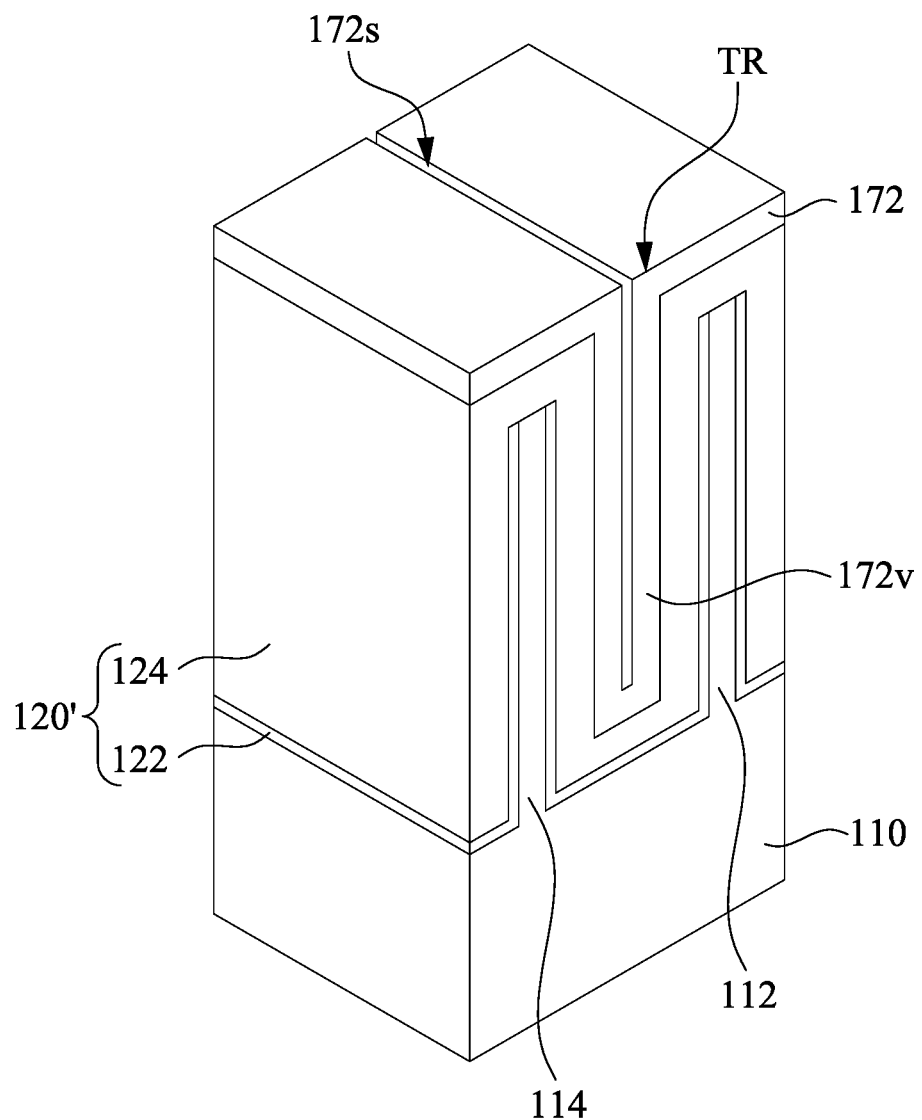

Returning to FIG. 1, the method M then proceeds to block S103 where a dielectric layer is formed over the spacing layer material and in the trench between the semiconductor fins. With reference to FIG. 4, in some embodiments of block S103, a dielectric layer 172 is conformally formed above the structure in FIG. 3. In greater detail, the dielectric layer 172 is formed over the spacing layer material 120' and in the trench TR between the semiconductor fins 112 and 114. As shown in FIG. 4, vertical portions 172v of the dielectric layer 172 in the trench TR between the semiconductor fins 112 and 114 are spaced apart from each other, such that a seam 172s is formed therebetween. The seam 172s may have an aspect ratio about 1:80 to about 1:90. By way of example but not limitation, the seam 172s may have a width in a range about 100 nm to about 500 nm and the seam 172s may have a depth in a range about 80 nm to about 90 nm. In some embodiments, the dielectric layer 172 may include silicon nitride, silicon oxide, silicon oxynitride, SiCN, SiCON, SiOC, or other suitable materials. In some embodiments, the dielectric layer 172 is deposited with an ALD process or other suitable processes.

Figure 5:
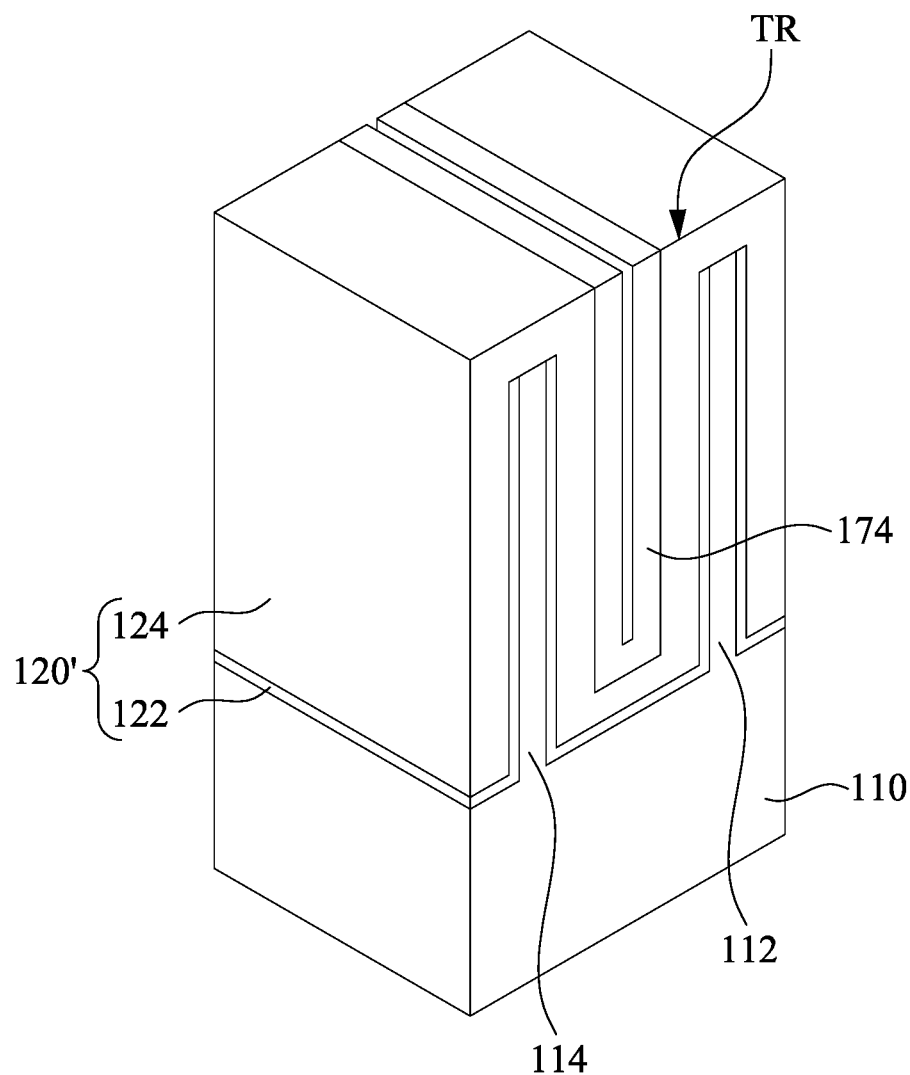

Returning to FIG. 1, the method M then proceeds to block S104 where a planarization process is performed to remove excess portions of the dielectric layer above the spacing layer material to form a dummy fin structure in the trench. With reference to FIG. 5, in some embodiments of block S104, a planarization (e.g., CMP) process is performed to remove excess portions of the dielectric layer 172 above the spacing layer material 120' to form a dummy fin structure 174 in the trench TR.

Figure 6:
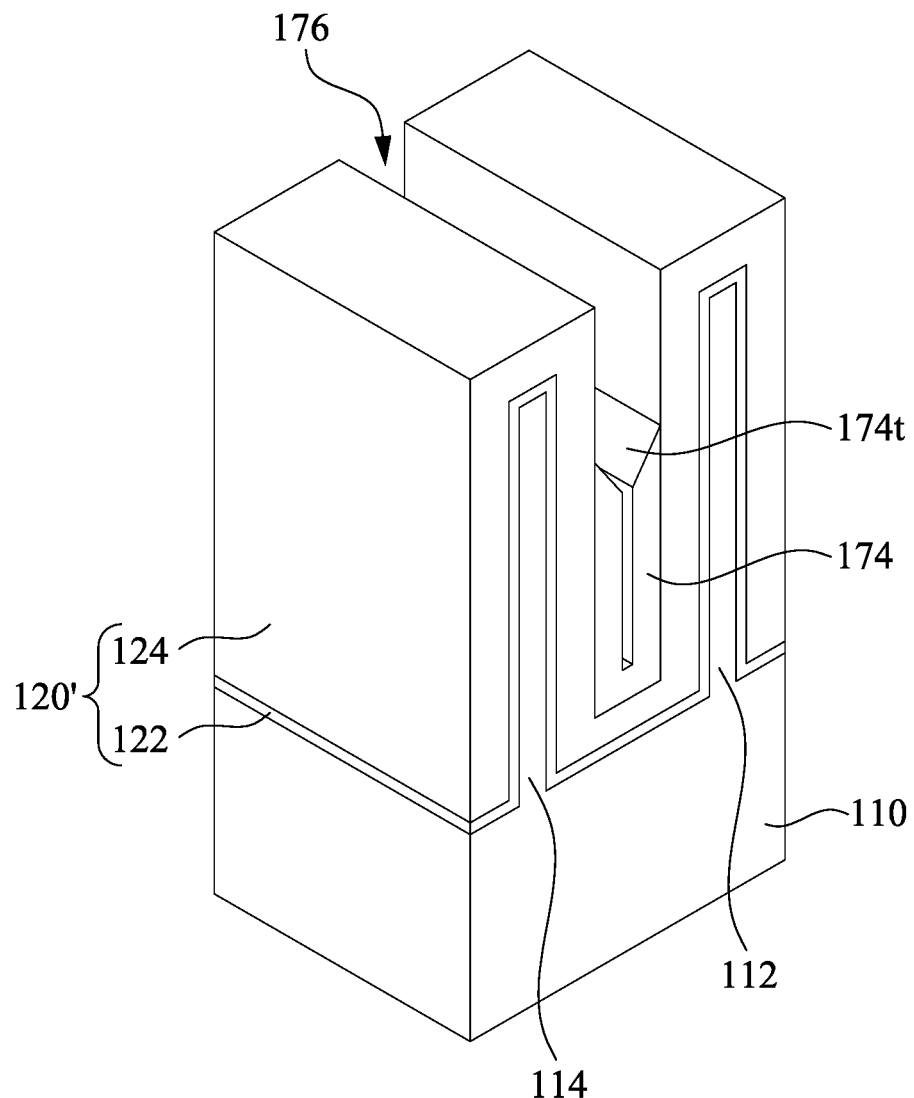

Returning to FIG. 1, the method M then proceeds to block S105 where the dummy fin structure is recessed to form a recess thereon. With reference to FIG. 6, in some embodiments of block S105, the dummy fin structure 174 is recessed to form a recess 176 thereon. In some embodiments, multiple etching processes are performed to recess the dummy fin structure 174. The etching processes include dry etching process, wet etching process, or combinations thereof. In some embodiments, a top surface 174t of the dummy fin structure 174 is lower than top surfaces of the semiconductor fins 112 and 114. In some embodiments, the top surface 174t of the dummy fin structures 174 may be at an intermediate level between the semiconductor fins 112 and 114 and the topmost surface of the spacing layer material 120'. In some embodiments, the top surface 174t of the dummy fin structures 174 has a V-shaped cross section.

Figure 10A:
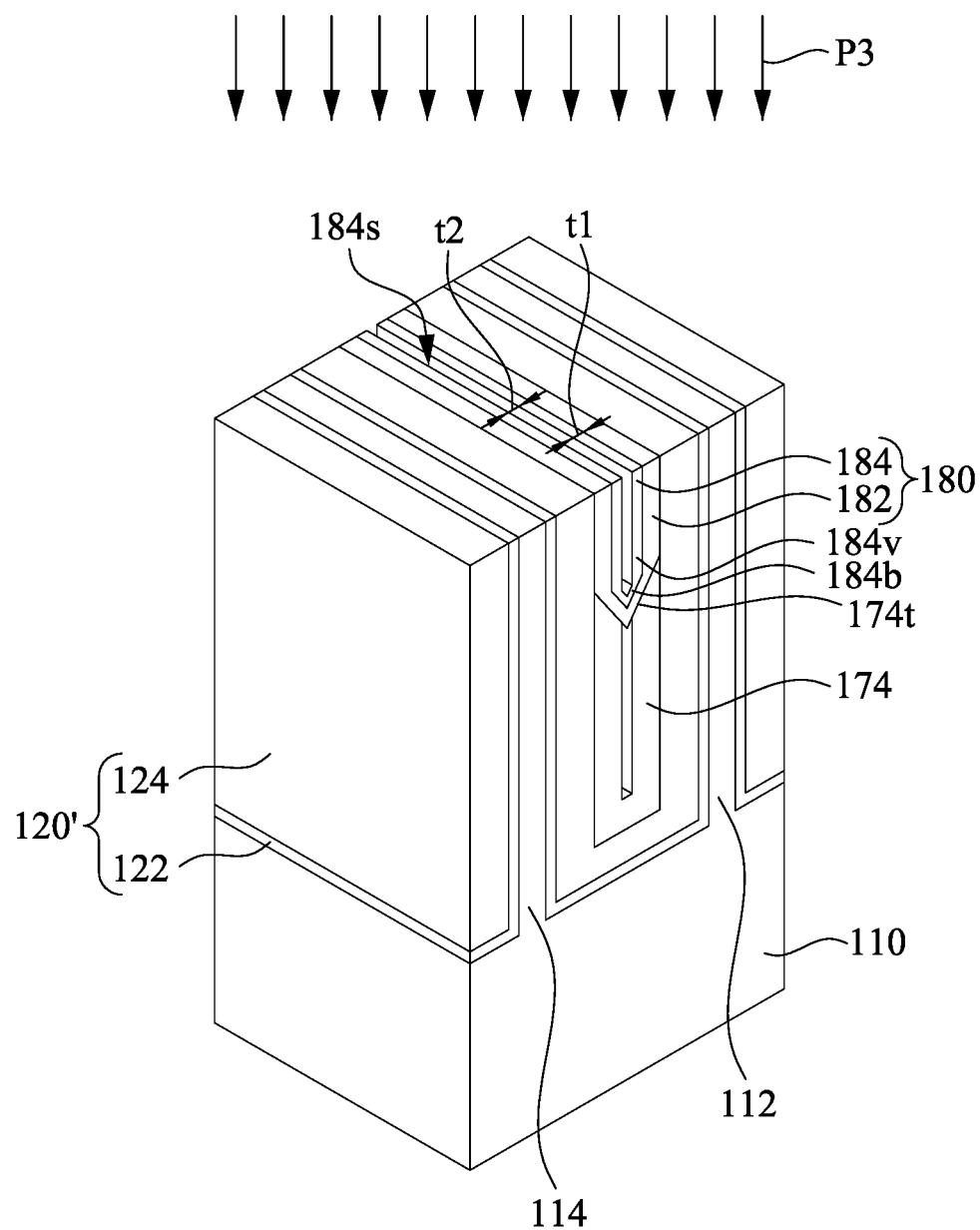
Figure 10B:
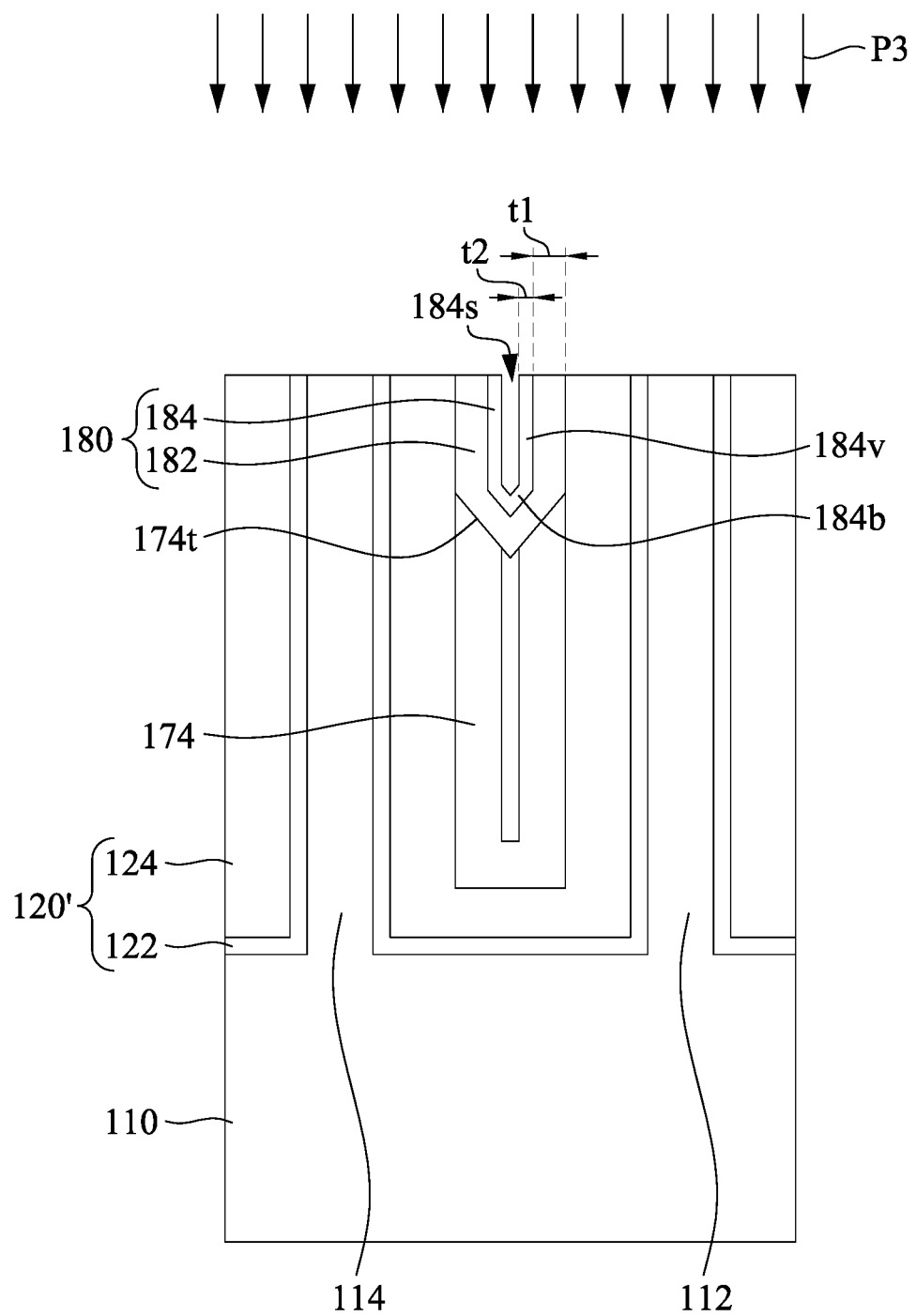

Returning to FIG. 1, the method M then proceeds to block S106 where a hard mask structure is formed over the dummy fin structure in the recess. With reference to FIGS. 10A and 10B, in some embodiments of block S106, a hard mask structure 180 is formed over the dummy fin structure 174 in the recess 176 (see FIG. 6). The hard mask structure 180 has a higher etching resistance than the semiconductor fins 112 and 114, and thus the hard mask structure 180 can be used to prevent damage to the dummy fin structure 174 therebelow by subsequent processing (e.g., subsequent etching the semiconductor fins 112 and 114 in block S110 with reference to FIG. 14).

As shown in FIGS. 10A and 10B, the hard mask structure 180 includes a hard mask layer 182 formed over the dummy fin structure 174 and a hard mask layer 184 formed over the hard mask layer 182. The hard mask layer 182 is in a crystalline state and the hard mask layer 184 is in an amorphous state. Therefore, the hard mask layer 182 and the hard mask layer 184 may also be interchangeably referred to as a crystalline mask layer and an amorphous hard mask layer in this context. The as-deposited hard mask layer 182 is to be crystallized (e.g., by using a thermal crystallization process) to have a higher etching resistance than the semiconductor fins 112 and 114. In some cases, during the crystallization and grain growth of the as-deposited hard mask layer 182, profile distortion may occur in the crystalline hard mask layer 182, thereby forming void formation in the hard mask structure 180. In some embodiments, an unwanted electrical connection may be in the hard mask structure 180 associated with the void formation. More particularly, in a subsequent gate replacement operation, as a space between gate spacers having the hard mask structure 180 therein will be filled with a conductive material to form gate electrodes, the conductive material fills the void formation as well, and thus the conductive material in the void formation forms the unwanted electrical connection.

In FIGS. 10A and 10B, the amorphous hard mask layer 184 is used to limit the profile distortion of the crystalline hard mask layer 182 during crystallization to avoid the formation of voids inside the hard mask structure 180, and thereby improving electrical performance of the semiconductor device. In some embodiments, the amorphous hard mask layer 184 may have an etching resistance higher than the semiconductor fins 112 and 114 and lower than the crystalline hard mask layer 182 during etching the semiconductor fins 112 and 114 in block S110 with reference to FIG. 14. Also, the amorphous hard mask layer 184 can be used to prevent damage to the dummy fin structure 174 therebelow by subsequent processing (e.g., subsequent etching the semiconductor fins 112 and 114). As shown in FIGS. 10A and 10B, each of the crystalline and amorphous hard mask layers 182 and 184 has an U-shaped cross section. Each of vertical portions 184v of the amorphous hard mask layer 184 has a straight innermost surface without profile distortion and form a seam 184s therebetween, in which the seam 184s extending upwardly from a bottom portion 184b of the amorphous hard mask layer 184 to a topmost position of the amorphous hard mask layer 184. The seam 184s has an aspect ratio about 1:40 to about 1:50. By way of example but not limitation, the seam 184s may have a width in a range about 100 nm to about 500 nm and the seam 184s may have a depth in a range about 40 nm to about 50 nm. In some embodiments, the amorphous hard mask layer 184 has a thinner thickness t2 than a thickness t1 of the crystalline hard mask layer 182.

In some embodiments, the hard mask layer 184 is doped to have a higher crystallization temperature than the hard mask layer 182. Therefore, the as-deposited hard mask layer 184 is amorphous and remains amorphous after annealing the hard mask layer 182 to crystallize. Hence, the hard mask layer 184 having the dopant therein can be used to limit the profile distortion of the hard mask layer 182 during crystallization to avoid the formation of voids inside the hard mask structure 180. In some embodiments, an atomic percentage content of the dopant in the hard mask layer 184 may be greater than about 10%, by way of example but not limitation. In some embodiments, the dopant includes silicon (Si), aluminum (Al), suitable material, or combinations thereof.

If the atomic percentage content of the dopant in the as-deposited hard mask layer 184 is lower than 10%, a crystallization temperature of the hard mask layer 184 may be insufficient to distinguish from a crystallization temperature of the hard mask layer 182, such that the as-deposited hard mask layer 184 may be crystallized after annealing the hard mask layer 182 to crystallize, thereby forming void formation in the hard mask structure 180. In some embodiments, the hard mask layer 184 has a higher atomic percentage content of the dopant than the hard mask layer 182. By way of example but not limitation, an atomic percentage content of the dopant in the as-deposited hard mask layer 182 may be less than about 10%. By way of example but not limitation, the as-deposited hard mask layer 182 is dopant-free.

In some embodiments, the hard mask layer 182 and/or the hard mask layer 184 may be made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the hard mask layer 182 and/or the hard mask layer 184 is made of a material different than the dummy fin structure 174. By way of example but not limitation, the hard mask layer 182 may be made of $HfO_2$ and the hard mask layer 184 may be made of silicon-containing hafnium oxide $(HfO_2)_x(SiO_2)_y$ (where x+y=1, x>0, y>0).

In various examples, the hard mask layer 182 and/or the hard mask layer 184 may be deposited by an ALD process, a CVD process, a subatmospheric CVD (SACVD) process, a flowable CVD process, a PVD process, or other suitable process.

In certain embodiments of block S106, with reference to FIGS. 7A-10B, the forming of the hard mask structure 180 may be a cyclic process including at least one repetition of a crystalline hard mask layer forming step and an amorphous hard mask layer forming step. For example, it may perform a crystalline hard mask layer forming step (e.g., FIGS. 7A and 7B) followed by an amorphous hard mask layer forming step (e.g., FIGS. 8A and 8B), and repeats another crystalline hard mask layer forming step (not shown) and another amorphous hard mask layer forming step (not shown).

Figure 7A:
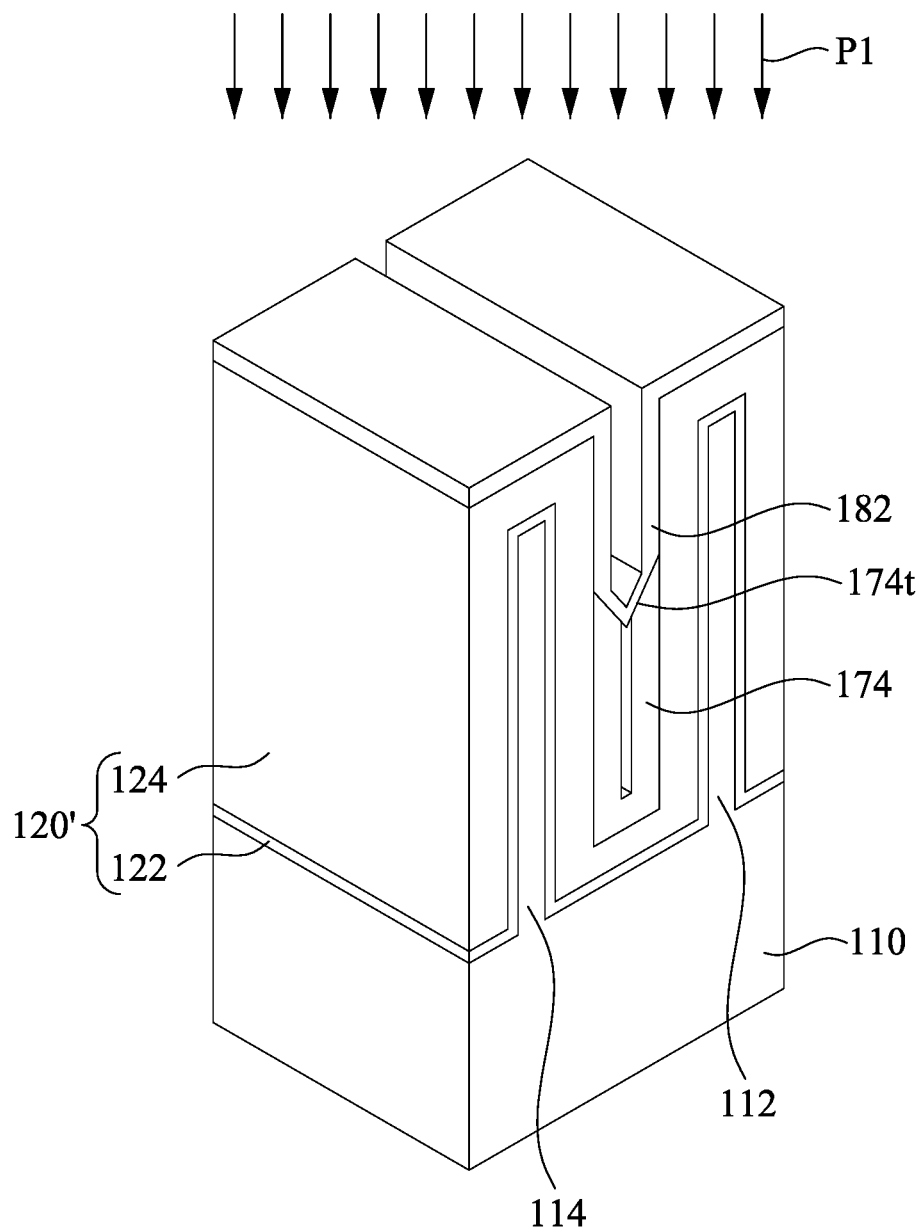
Figure 7B:
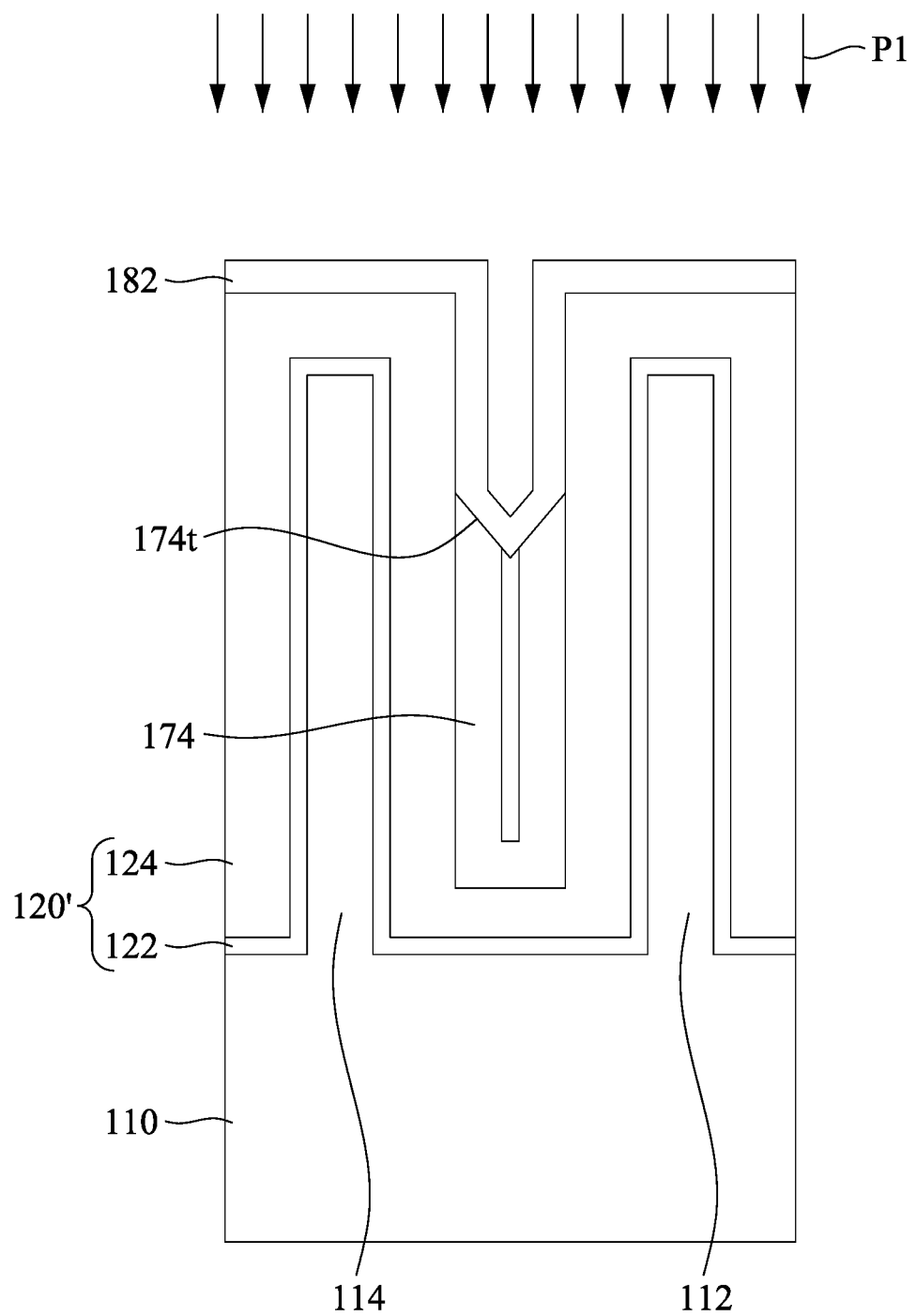
FIGS. 7B, 8B, 9B, 10B, 11B, and 20B are side views of FIGS. 7A, 8A, 9A, 10A, 11A, and 20A.

Reference is made to FIGS. 7A and 7B. The hard mask layer 182 is conformally formed over the spacing layer material 120' and the dummy fin structure 174. In some embodiments, an atomic layer deposition (ALD) process P1 is employed to form the hard mask layer 182. As a result, the thickness of the hard mask layer 182 can be controlled using cycle times of the ALD process P1. In some embodiments, the ALD process P1 may include a plurality of cycles (e.g., about 25 cycles to about 100 cycles) to form the hard mask layer 182 with a thickness ranging from about 1.5 nm to about 6 nm, by way of example but not limitation. For example, the ALD process P1 may include about 100 cycles.

In some embodiments, the hard mask layer 182 may be made of $HfO_2$. By way of example but not limitation, the ALD process P1 is performed using a hafnium precursor and an oxidant co-precursor to deposit the hard mask layer 182. By way of example but not limitation, the hafnium precursor may include tetrakis (ethylmethylamino) hafnium (TEMAH), tetrakis-diethylamido hafnium (i.e., $Hf[N(C_2H_5)_2]_4$, TDEAHf), $Hf(OC(CH_3)_3)_4$ (i.e., Hf-t-butoxide), $HfCl_4$, or any other suitable hafnium precursor. The oxidant co-precursor may include $H_2O$, $O_3$ and $O_2$ plasma, or any other suitable oxidant co-precursor. In some embodiments, the hard mask layer 182 is formed without using silicon precursor and thus is free of silicon. Therefore, the hard mask layer 182 may also be interchangeably referred to as a silicon-free hard mask layer.

In a case where the ALD process P1 may implement $HfCl_4$ and $H_2O$ as the precursors. The dose of $HfCl_4$ introduces to the substrate 110 before making contact with the spacing layer material 120' and the dummy fin structure 174. The OH groups on the spacing layer material 120' and the dummy fin structure 174 represent surface sites that can react with incoming $HfCl_4$ molecules. Then, the $HfCl_4$ molecules have reacted with surface sites on the spacing layer material 120' and the dummy fin structure 174 and left a monolayer of Hf atoms which still have part of the ligand structure connected to them. The incoming $HfCl_4$ molecule exchanges one, or more, of its ligand branches for species on the surface bonded to oxygen (hydrogen atoms). The reaction evolves 4HCl which is removed from the substrate 110 in an inert purge leaving surface species that the oxidant dose can react with. Then, a dose of $H_2O$ is introduced to the substrate 110 and reacts with the surface species from the previous step. Then, the substrate 110 is purged removing more evolved HCl and leaving alternative surface species so that further reaction steps can take place. In a binary deposition process these steps are repeated to build the hard mask layer 182 conformally formed on the spacing layer material 120' and the dummy fin structure 174.

By way of example but not limitation, with increasing the temperature from about 400 to about 600° C., the crystal quality of $HfO_2$ film is gradually enhanced. In FIGS. 7A and 7B, the ALD process P1 is performed at a temperature prevents the hard mask layer 182 from crystallizing. In other words, the ALD process P1 is performed at a temperature lower than a crystallization temperature of the hard mask layer 182. By way of example but not limitation, the ALD process P1 is performed at a lower temperature than about 400° C. to prevent the hard mask layer 182 from crystallizing. In some embodiments, the ALD process P1 is performed at a temperature lower than about 600, 550, 450, or 400° C. On the other hand, the ALD process P1 may be performed at a temperature in a range from about 100 to about 400° C., such as about 100, about 150, about 200, about 250, about 300, about 350, or about 400° C.

Figure 8A:
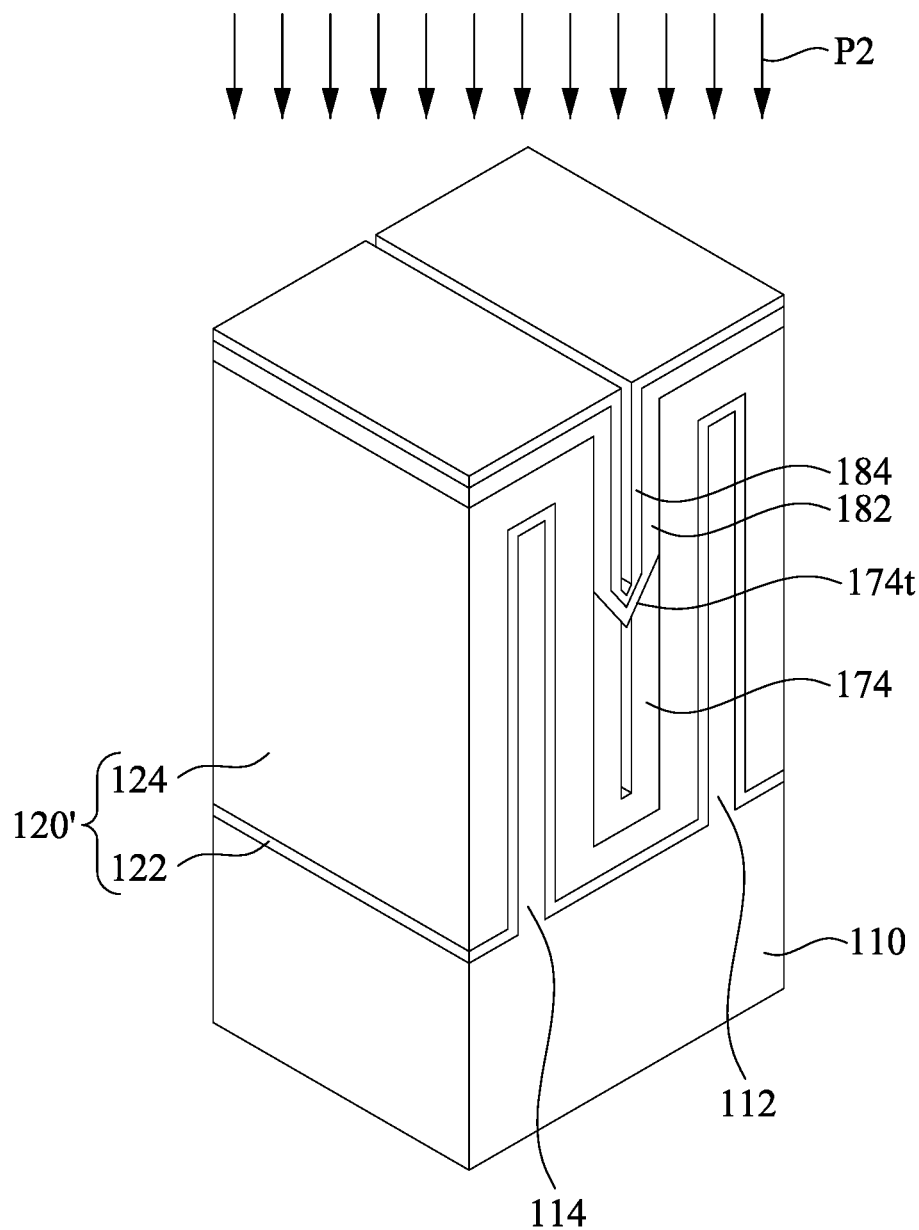
Figure 8B:
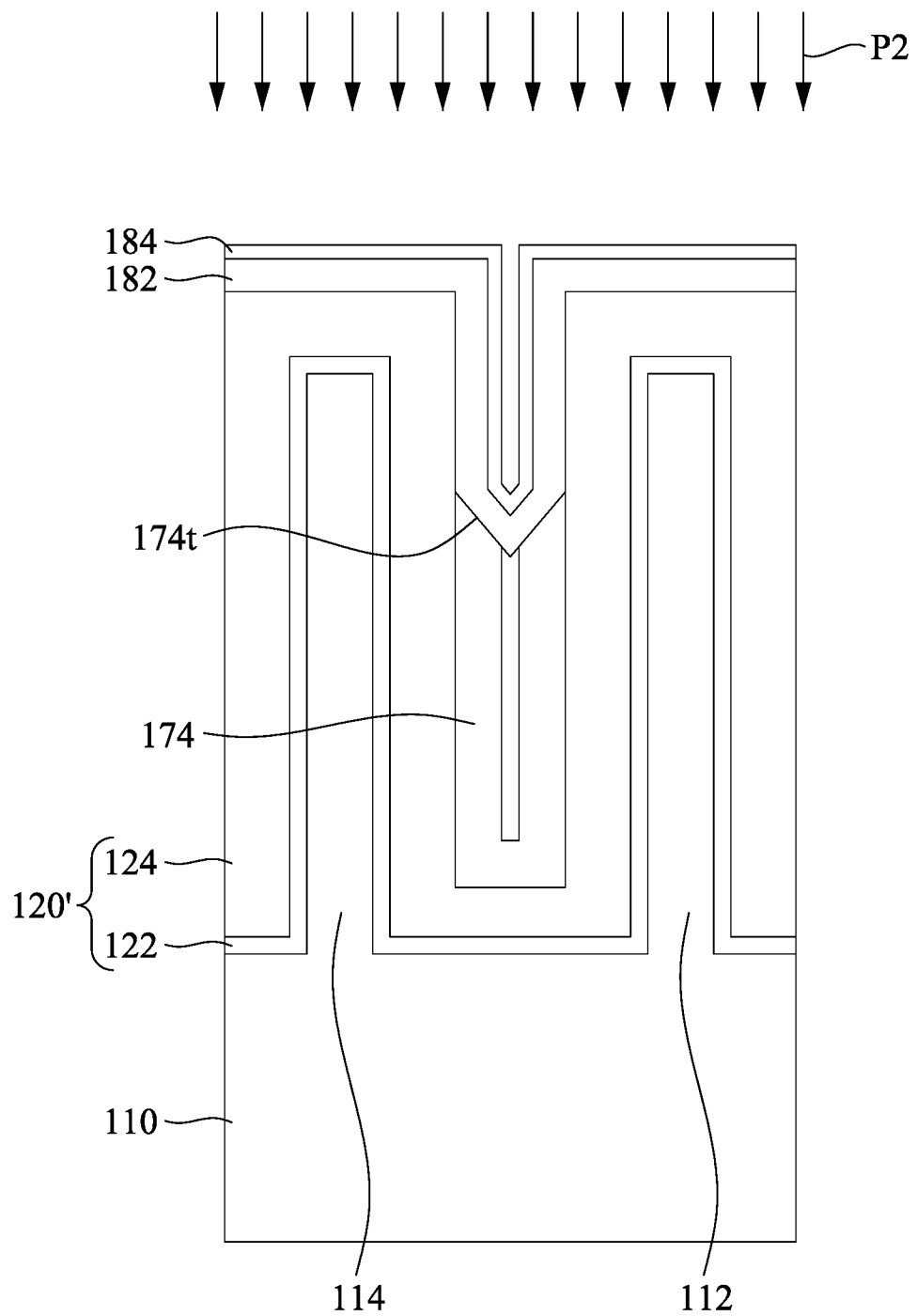

Reference is made to FIGS. 8A and 8B. The hard mask layer 184 is conformally formed over the hard mask layer 184. In some embodiments, the hard mask layer 184 has a dopant, such as silicon, than the hard mask layer 182 to have a higher crystallization temperature than the hard mask layer 182. The ALD process P2 is performed at a temperature prevents the hard mask layer 182 from crystallizing. In other words, the ALD process P2 is performed at a lower temperature than the crystallization temperature of the hard mask layer 182. By way of example but not limitation, the ALD process P2 is performed at a temperature lower than about 400° C. to prevent the hard mask layer 182 from crystallizing. In some embodiments, the ALD process P2 is performed at a temperature lower than about 600, 550, 450, or 400° C. On the other hand, the ALD process P2 may be performed at a temperature in a range from about 100 to about 400° C., such as about 100, 150, 200, 250, 300, 350, or 400° C. Therefore, the as-deposited hard mask layer 184 is amorphous and remains amorphous after annealing the hard mask layer 182 to crystallize.

In some embodiments, the thickness of the hard mask layer 184 can be controlled using cycle times of the ALD process P2. In some embodiments, the ALD process P2 may include a plurality of cycles (e.g., about 25 cycles to about 100 cycles) to form the hard mask layer 184 with a thickness ranging from about 1.5 nm to about 6 nm, by way of example but not limitation. For example, the ALD process P2 may include about 100 cycles.

In some embodiments, the hard mask layer 184 may be made of a Si-doped hafnium oxide. By way of example but not limitation, the ALD process P2 is performed using a hafnium precursor, a silicon precursor, and an oxidant co-precursor to deposit the hard mask layer 184. By way of example but not limitation, the hafnium precursor may include tetrakis (ethylmethylamino) hafnium (TEMAH), tetrakis-diethylamido hafnium (i.e., $Hf[N(C_2H_5)_2]_4$, TDEAHf), $Hf(OC(CH_3)_3)_4$ (i.e., Hf-t-butoxide), $HfCl_4$, or any other suitable hafnium precursor. The silicon precursor may include $SiCl_4$, or any other suitable silicon co-precursor. The oxidant co-precursor may include $H_2O$, $O_3$ and $O_2$ plasma, or any other suitable oxidant co-precursor. In some embodiments, a silicon atomic percentage content of the hard mask layer 184 may be greater than about 10%, such as about 14%, about 26%, or about 46%, by way of example but not limitation.

If the silicon atomic percentage content of the as-deposited hard mask layer 184 is lower than 10%, a crystallization temperature of the hard mask layer 184 may not be enough to distinguish from a crystallization temperature of the hard mask layer 182, such that the as-deposited hard mask layer 184 may be crystallized after annealing the hard mask layer 182 to crystallize, thereby forming void formation in the hard mask structure 180. In some embodiments, the hard mask layer 184 has a higher silicon atomic percentage content than the hard mask layer 182. By way of example but not limitation, the silicon atomic percentage content of the as-deposited hard mask layer 182 may be less than about 10%. By way of example but not limitation, the as-deposited hard mask layer 182 is silicon-free.

In some embodiments, the hard mask layers 182 and 184 are in-situ deposited in the same process apparatus (i.e., performed in the same ALD chamber). In some embodiments, the hard mask layers 182 and 184 are ex-situ formed in different process apparatuses (i.e., performed in different ALD chambers).

Figure 9A:
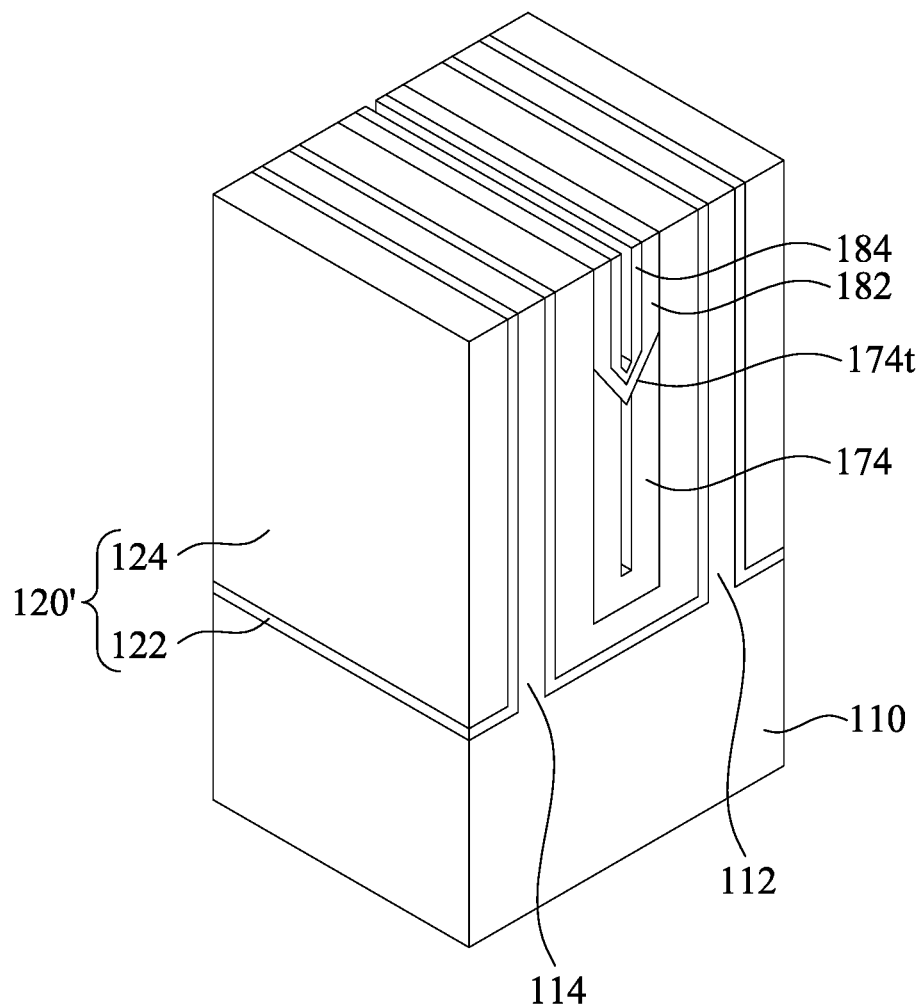
Figure 9B:
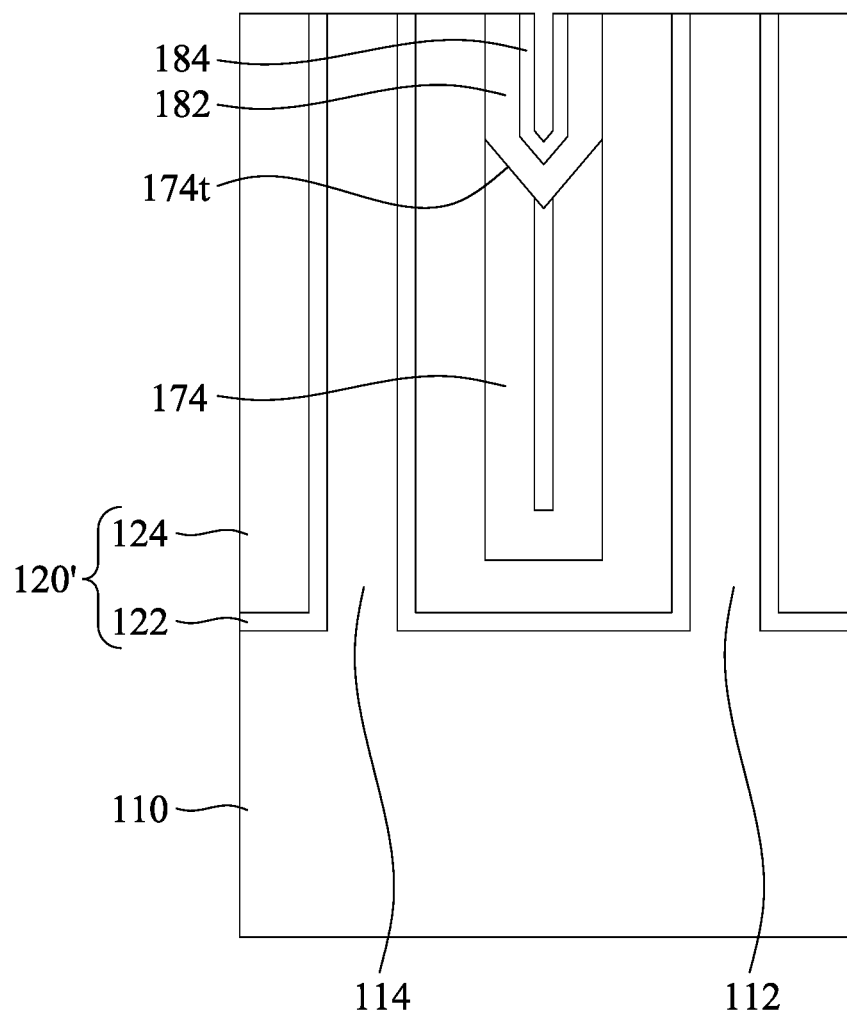

Reference is made to FIGS. 9A and 9B. A planarization (e.g., CMP) process is performed to remove excess portion of the first and second hard mask layers 182 and 184 and the spacing layer material 120' above the semiconductor fins 112 and 114 to form the mask layers 180.

Reference is made to FIGS. 10A and 10B. An annealing process P3 is performed on the substrate 110 to crystallize the as-deposited hard mask layer 182 in the hard mask structure 180. The as-deposited hard mask layer 184 has a higher crystallization temperature than the as-deposited hard mask layer 182. Thus, the annealing process P3 is performed such that the as-deposited hard mask layer 184 is amorphous and remains amorphous after annealing the hard mask layer 182 to crystallize. In other words, the annealing process P3 is performed at a third temperature higher than the crystallization temperature of the hard mask layer 182 and lower than the crystallization temperature of the hard mask layer 184. In some embodiments, with increasing the annealing temperature from about 450° C. to about 900° C., the crystal quality of the as-deposited hard mask layer 182 made of $HfO_2$ is gradually enhanced to improve the etching resistance thereof. In some embodiments, the main lattice arrangements of the hard mask layer 182 may include monoclinic $HfO_2$ (−111), monoclinic $HfO_2$ (200), and orthorhombic $HfO_2$ (111). Further increasing the annealing temperature, the lattice structure of orthorhombic $HfO_2$ (111) may dominate the crystalline structure.

In some embodiments, the annealing process P3 may be a rapid thermal annealing performed in $N_2$ ambient. By way of example but not limitation, the annealing temperature may be higher than 450° C. to crystallize the hard mask layer 182. The annealing temperature may be in a range from about 450 to about 1000° C., such as about 450, 500, 600, 700, 800, 900, or 1000° C. Therefore, after the annealing process P3 is complete, the as-deposited hard mask layer 182 is crystalline and the as-deposited hard mask layer 184 remains amorphous to limit the profile distortion of the crystalline hard mask layer 182 during crystallization.

Figure 11A:
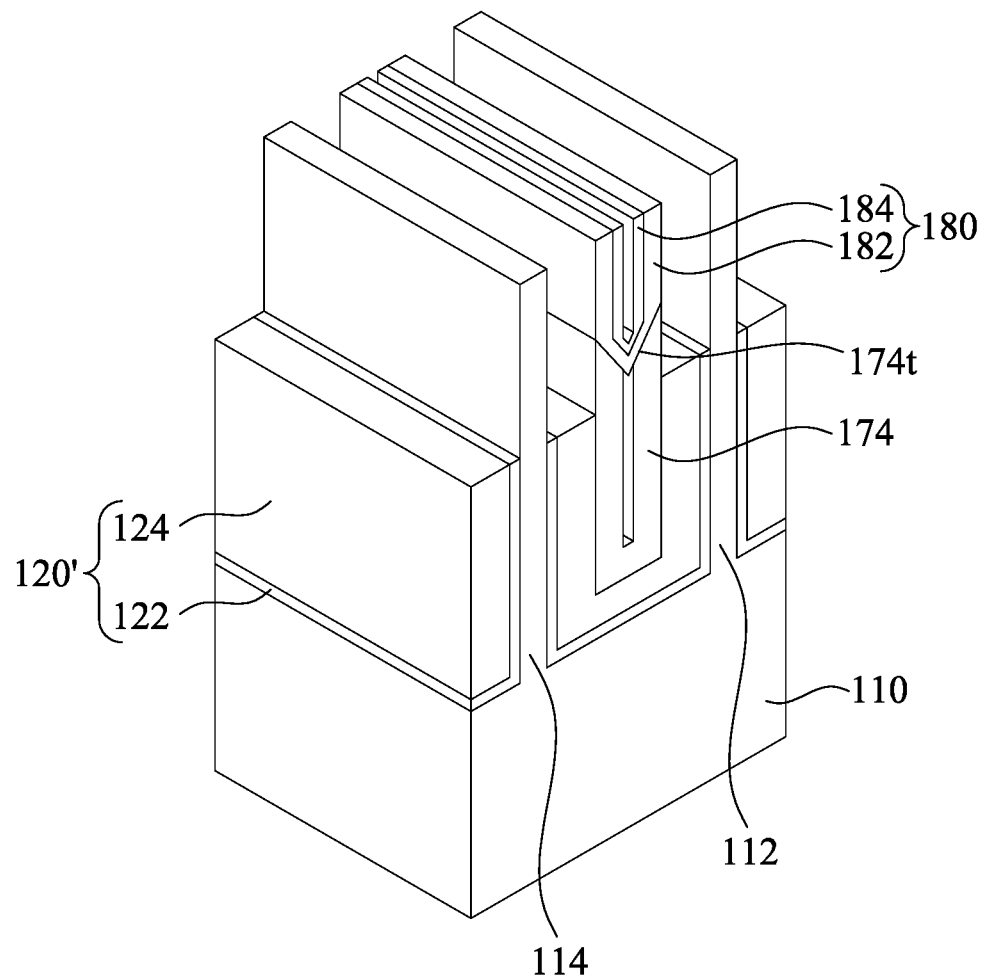
Figure 11B:
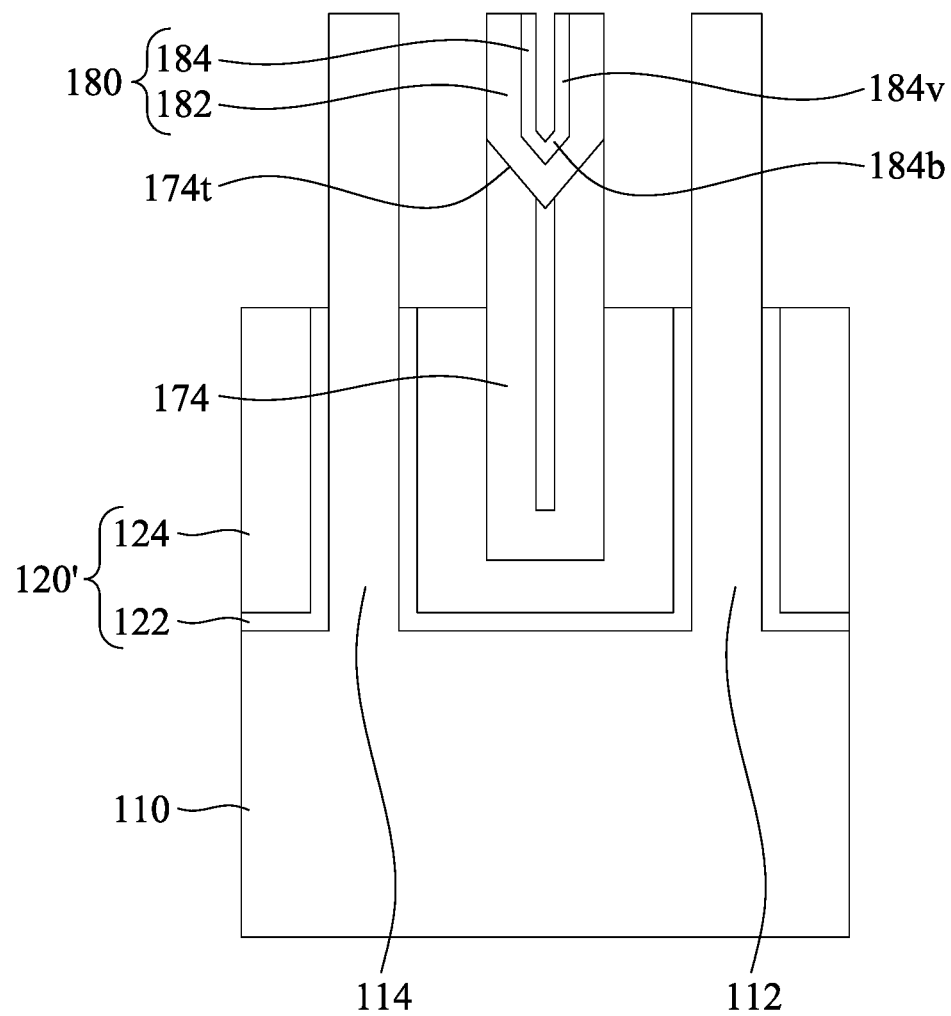

Returning to FIG. 1, the method M then proceeds to block S107 where the spacing layer material is etched back such that portions of the semiconductor fins and the dummy fin structure having the hard mask structure thereon protrude from the remaining portions of the spacing layer material. With reference to FIGS. 11A and 11B, in some embodiments of block S107, the spacing layer material 120' (see FIGS. 10A and 10B) is then etched back such that portions of the semiconductor fins 112 and 114 and the dummy fin structure 174 having the hard mask structure 180 thereon protrude from the remaining portions of the spacing layer material 120'. The remaining portions of spacing layer material 120' forms spacing layer 120. The spacing layer 120 in the trench TR can also be referred to as a shallow trench isolation (STI) structure. The spacing layer 120 can be achieved by suitable methods such as, for example, an etch process that has suitable etch selectivity between materials of the spacing layer material 120', the semiconductor fins 112 and 114, the dummy fin structure 174, and the hard mask structure 180. For example, the etch process can have a higher etch rate of the spacing layer material 120' than the etch rate of the semiconductor fins 112 and 114, the dummy fin structure 174, and/or the hard mask structure 180. In some embodiments, etching rate difference be achieved by adjusting suitable parameters of the etch process such as, for example, etchant gas type, gas flow rate, etching temperature, plasma power, chamber pressure, other suitable parameters, and/or combinations thereof.

Figure 12:
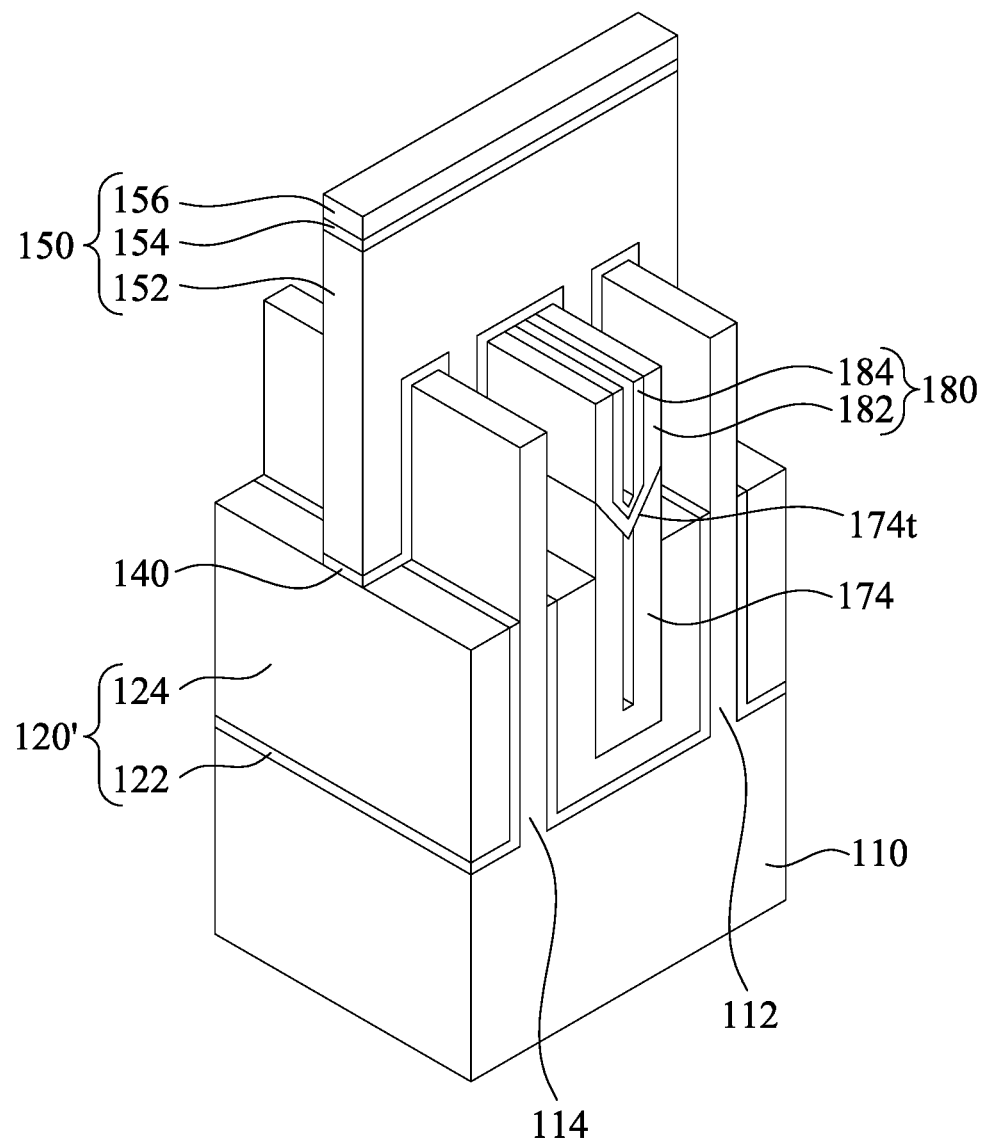

Returning to FIG. 1, the method M then proceeds to block S108 where a dummy gate structure is formed across the semiconductor fins and the dummy fin structure having the hard mask structure thereon. With reference to FIG. 12, in some embodiments of block S108, a sacrificial gate dielectric layer 140 is conformally formed above the structure of FIGS. 11A and 11B. In some embodiments, the sacrificial gate dielectric layer 140 may include silicon dioxide, silicon nitride, a high-K dielectric material or other suitable material. In various examples, the sacrificial gate dielectric layer 140 may be deposited by an ALD process, a CVD process, a subatmospheric CVD (SACVD) process, a flowable CVD process, a PVD process, or other suitable process. By way of example, the sacrificial gate dielectric layer 140 may be used to prevent damage to the semiconductor fins 112 and 114 by subsequent processing (e.g., subsequent formation of the dummy gate structure).

Subsequently, a dummy gate structure 150 is formed above the sacrificial gate dielectric layer 140. The dummy gate structure 150 includes a dummy gate layer 152, a pad layer 154 formed over the dummy gate layer 152, and a mask layer 156 formed over the pad layer 154. Formation of the dummy gate structure 150 includes depositing in sequence a dummy gate layer, a pad layer and a mask layer over the substrate 110, patterning the pad layer and mask layer into patterned pad layer 154 and mask layer 156 using suitable photolithography and etching techniques, followed by patterning the dummy gate layer using the pad layer 154 and the mask layer 156 as masks to form the patterned dummy gate layer 152. As such, the dummy gate layer 152, the pad layer 154, and the mask layer 156 are referred to as the dummy gate structure 150. The sacrificial gate dielectric layer 140 is then patterned using the dummy gate structure 150 as an etching mask. In some embodiments, the dummy gate layer 152 may be made of polycrystalline-silicon (poly-Si), poly-crystalline silicon-germanium (poly-SiGe), or other suitable materials. The pad layer 154 may be made of silicon nitride or other suitable materials, and the mask layer 156 may be made of silicon dioxide or other suitable materials.

Figure 13:
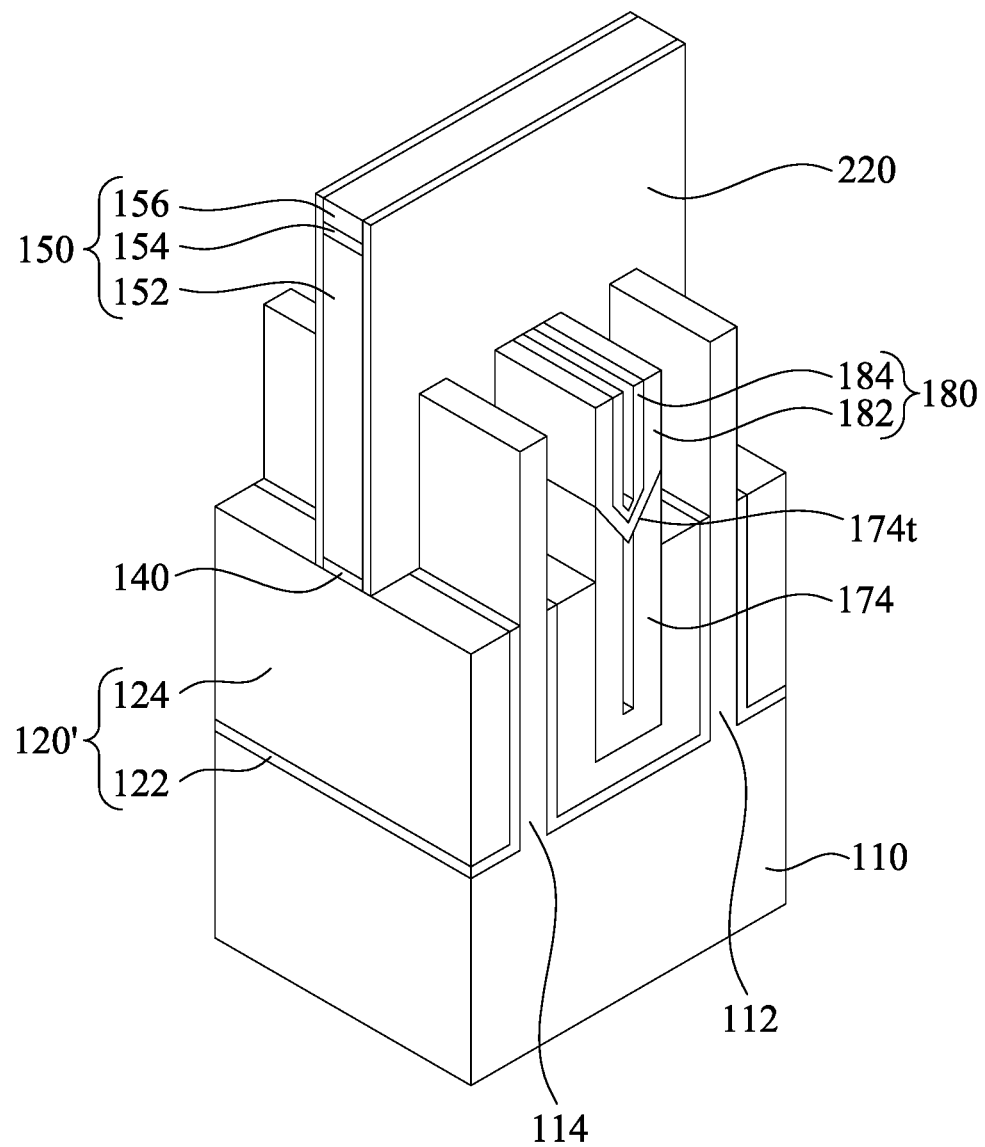

Returning to FIG. 1, the method M then proceeds to block S109 where gate spacers are respectively formed on sidewalls of the dummy gate structure. With reference to FIG. 13, in some embodiments of block S109, gate spacers 220 are respectively formed on sidewalls of the dummy gate structure 150. The gate spacers 220 may include a seal spacer and a main spacer (not shown). The gate spacers 220 include one or more dielectric materials, such as silicon oxide, silicon nitride, silicon oxynitride, SiCN, $SiC_xO_yN_z$, or combinations thereof. The seal spacers are formed on sidewalls of the dummy gate structure 150 and the main spacers are formed on the seal spacers. The gate spacers 220 can be formed using a deposition method, such as plasma enhanced chemical vapor deposition (PECVD), low-pressure chemical vapor deposition (LPCVD), sub-atmospheric chemical vapor deposition (SACVD), or the like. The formation of the gate spacers 220 may include blanket forming spacer layers, and then performing etching operations to remove the horizontal portions of the spacer layers. The remaining vertical portions of the gate spacer layers form the gate spacers 220.

Figure 14:
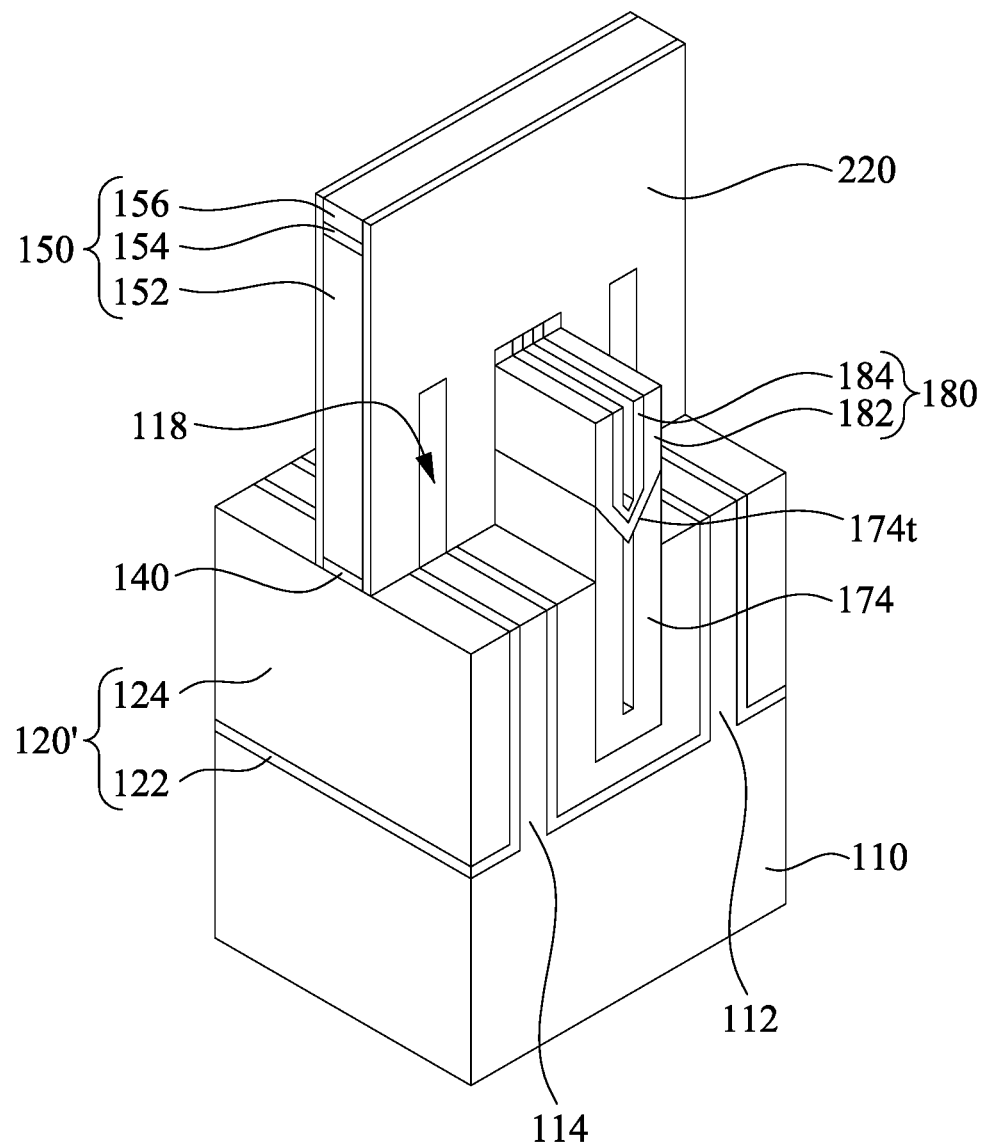

Returning to FIG. 1, the method M then proceeds to block S110 where a plurality of recesses are formed on opposite sides of the dummy gate structure by etching the semiconductor fins. With reference to FIG. 14, in some embodiments of block S110, recesses 118 are formed on opposite sides of the dummy gate structure 150 by etching the semiconductor fins 112 and 114. The dummy gate structure 150 and the gate spacers 160a act as etching masks in the formation of the recesses 118. The etching process includes a dry etching process, a wet etching process, or combinations thereof.

During this etching process, the hard mask structure 180 is recessed at the areas not covered by the dummy gate structure 150 or the gate spacers 220. In some embodiments, the etching process is performed with an anisotropic dry etch process. In some embodiments, the dry etch process etches the semiconductor fins 112 and 114 (e.g., Si, Ge, and/or SiGe) much faster than etching the hard mask structure 180 (e.g., metal oxides, SiON, and SiOCN). Due to this etch selectivity, the dry etch process patterns the semiconductor fins 112 and 114 vertically without complete etching the hard mask structure 180. In FIG. 14, portions of the hard mask structure 180 covered by the dummy gate structure 150 or the gate spacers 220 has a height greater than a height of the recessed portion of the hard mask structure 180.

Figure 15:
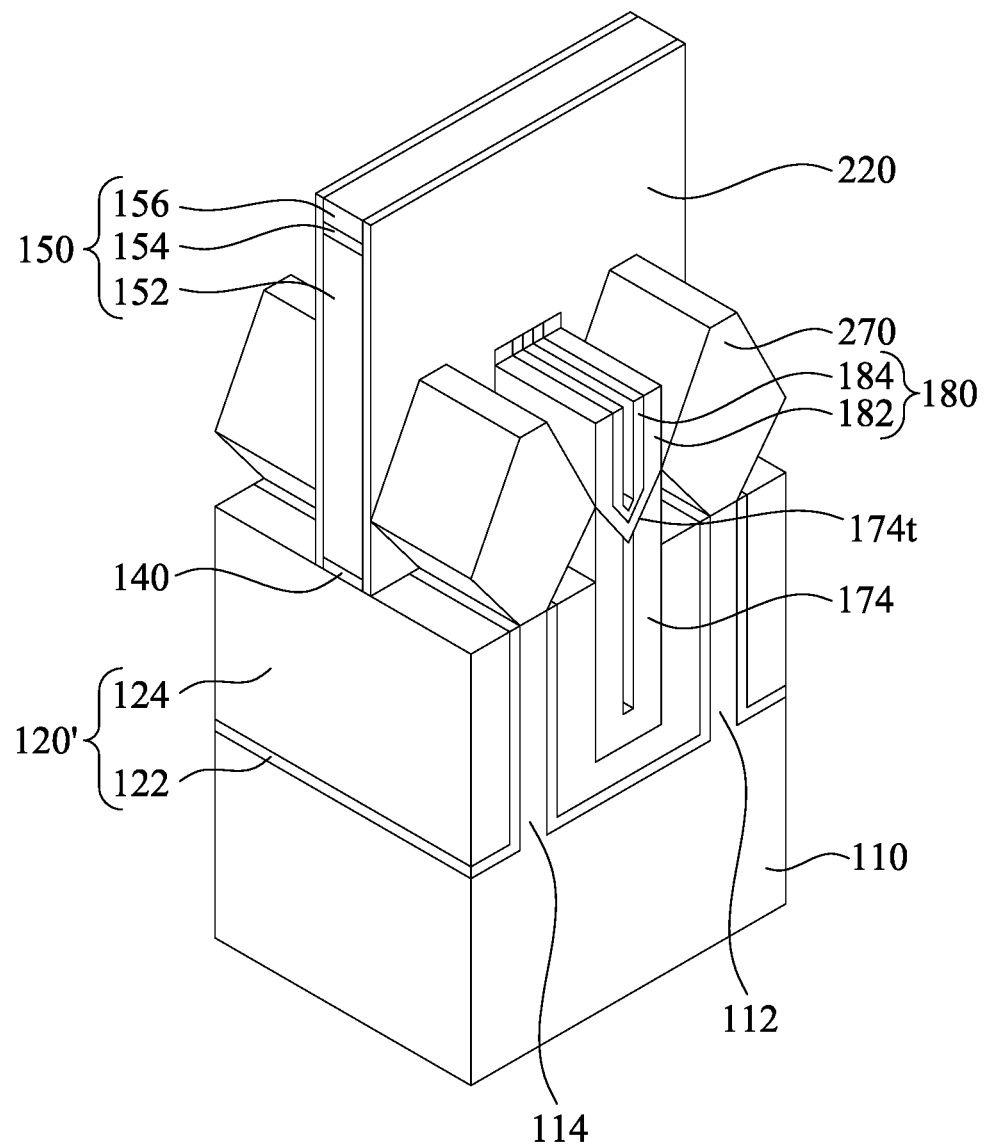

Returning to FIG. 1, the method M then proceeds to block S111 where semiconductor materials are then deposited in the recesses to form epitaxial structures. With reference to FIG. 15, in some embodiments of block S111, semiconductor materials are then deposited in the recesses 118 to form epitaxial structures 270 which are referred to as source/drain regions. The epitaxial structures 270 are form above the N-type region and/or the P-type region p. The epitaxial structures 270 may alternatively be referred to as raised source and drain regions. The semiconductor materials include a single element semiconductor material, such as germanium (Ge) or silicon (Si), compound semiconductor materials, such as gallium arsenide (GaAs), silicon arsenide (SiAs), or aluminum gallium arsenide (AlGaAs), or a semiconductor alloy, such as silicon germanium (SiGe), silicon germanium boron (SiGeB), or gallium arsenide phosphide (GaAsP). The epitaxial structure 270 have suitable crystallographic orientations (e.g., a (100), (110), or (111) crystallographic orientation). In some embodiments, the epitaxial structures 270 include source/drain epitaxial structures. In some embodiments, where an N-type device is desired, the epitaxial structures 270 may include an epitaxially grown silicon phosphorus (SiP) or silicon carbon (SiC). In some embodiments, where a P-type device is desired, the epitaxial structures 270 may include an epitaxially grown silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes. Desired p-type or n-type impurities may be, or may not be, doped while the epitaxial process. The doping may be achieved by an ion implantation process, plasma immersion ion implantation (PIII) process, gas and/or solid source diffusion process, other suitable process, or combinations thereof.

In some embodiments, the epitaxial structure 270 includes a first epitaxial layer and a second epitaxial layer. The first epitaxial layer is in direct contact with the recessed portion of the semiconductor fin 112 and/or the semiconductor fin 114, and the second epitaxial layer is above the first epitaxial layer. In some embodiments, the first and second epitaxial layers are crystalline semiconductor layers, such as Si, SiC, SiCP, and SiP, having different lattice constants from each other and from the semiconductor fin 112 and/or the semiconductor fin 114. When SiC, SiP and/or SiCP are used, the C or P concentration of the first epitaxial layer is different from that of the second epitaxial layer. In some embodiments, a Group III-V semiconductor layer is used for at least one of the first and second epitaxial layers. In some other embodiments, only one or two of the first and second epitaxial layers is formed, and in some other embodiments, more epitaxial layers are formed. For example, a third epitaxial structure may be formed above and wrap around the second epitaxial layer.

In some embodiments, the first and second epitaxial layers are crystalline semiconductor layers, such as Si, Ge, and SiGe, having different lattice constants from each other and from the semiconductor fin 112 and/or the semiconductor fin 114. When Si, Ge, and SiGe are used, the Ge atomic concentration of the first epitaxial layer is different from that of the second epitaxial layer. In some embodiments, a Group III-V semiconductor layer is used for at least one of the first and second epitaxial layers. In some other embodiments, only one or two of the first and second epitaxial layers is formed, and in some other embodiments, more epitaxial layers are formed. For example, a third epitaxial structure may be formed above and wrap around the second epitaxial layer.

Figure 16:
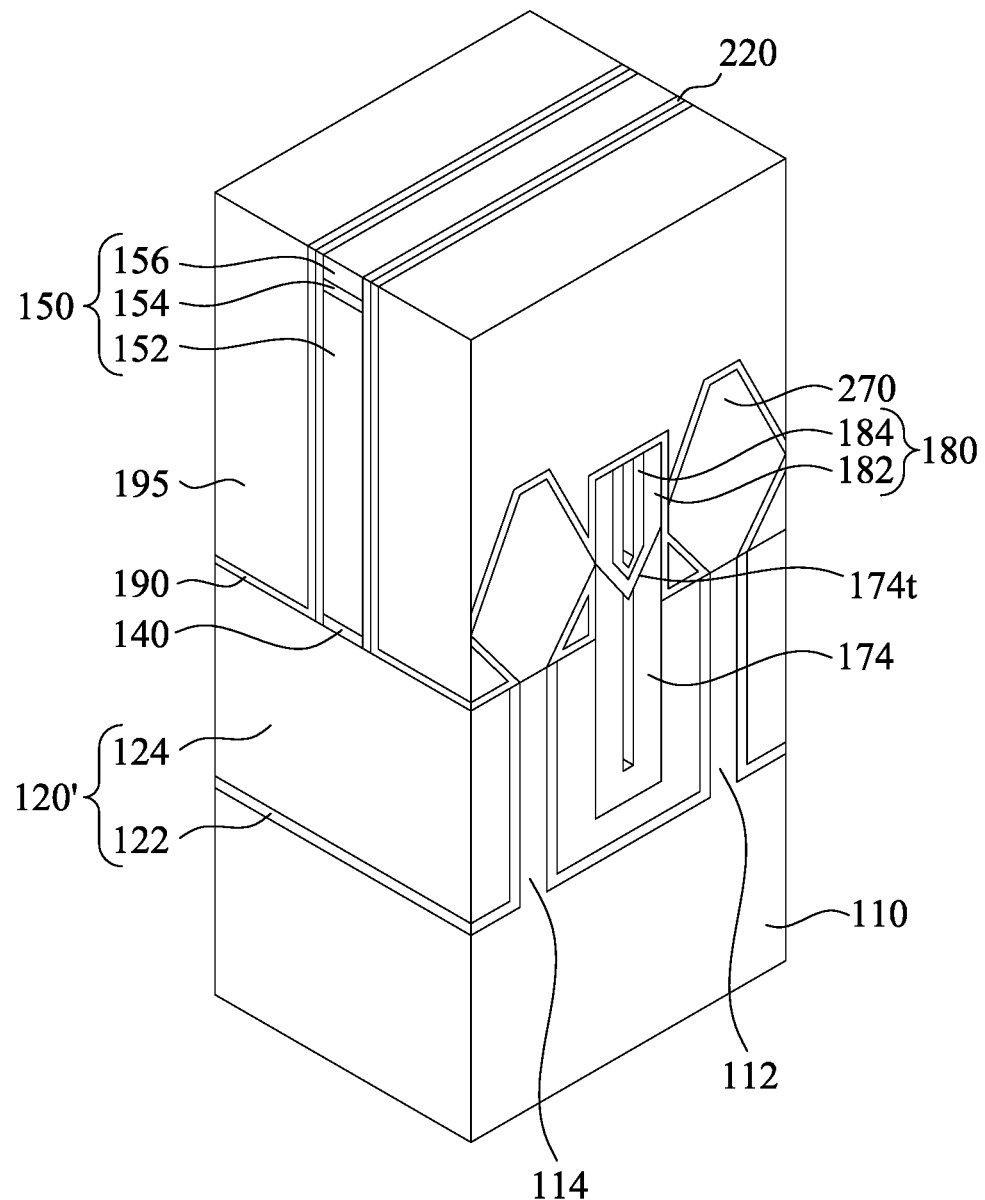

Returning to FIG. 1, the method M then proceeds to block S112 where a contact etch stop layer (CESL) is conformally formed over the substrate and an interlayer dielectric (ILD) is then formed on the CESL. With reference to FIG. 16, in some embodiments of block S112, a contact etch stop layer (CESL) 190 is conformally formed over the structure of FIG. 15. The CESL 190 extends along top surfaces of the first and second hard mask layers 182 and 184. In some embodiments, the CESL 190 can be a stressed layer or layers. In some embodiments, the CESL 190 has a tensile stress and is formed of $Si_3N_4$. In some other embodiments, the CESL 190 includes materials such as oxynitrides. In yet some other embodiments, the CESL 190 may have a composite structure including a plurality of layers, such as a silicon nitride layer overlying a silicon oxide layer. The CESL 190 can be formed using plasma enhanced CVD (PECVD), however, other suitable methods, such as low pressure CVD (LPCVD), atomic layer deposition (ALD), and the like, can also be used.

An interlayer dielectric (ILD) 195 is then formed on the CESL 190. The ILD 195 may be formed by chemical vapor deposition (CVD), high-density plasma CVD, spin-on, sputtering, or other suitable methods. In some embodiments, the ILD 195 includes silicon oxide. In some other embodiments, the ILD 195 may include silicon oxy-nitride, silicon nitride, compounds including Si, O, C and/or H (e.g., silicon oxide, SiCOH and SiOC), a low-k material, or organic materials (e.g., polymers). After the ILD 195 is formed, a planarization operation, such as CMP, is performed, so that the pad layer 154 and the mask layer 156 (see FIG. 15) are removed and the dummy gate layer 152 is exposed.

Figure 17:
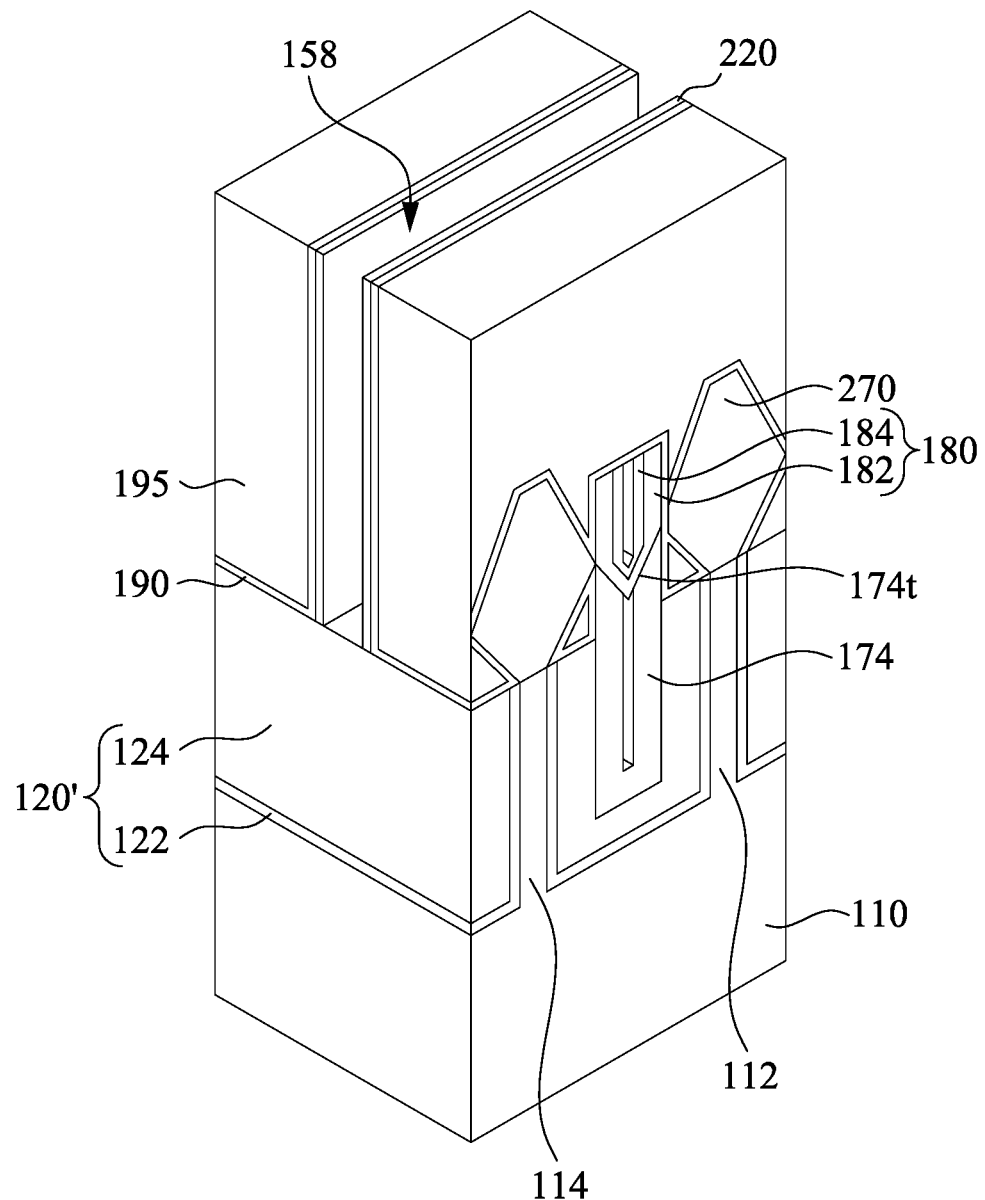
Figure 18:
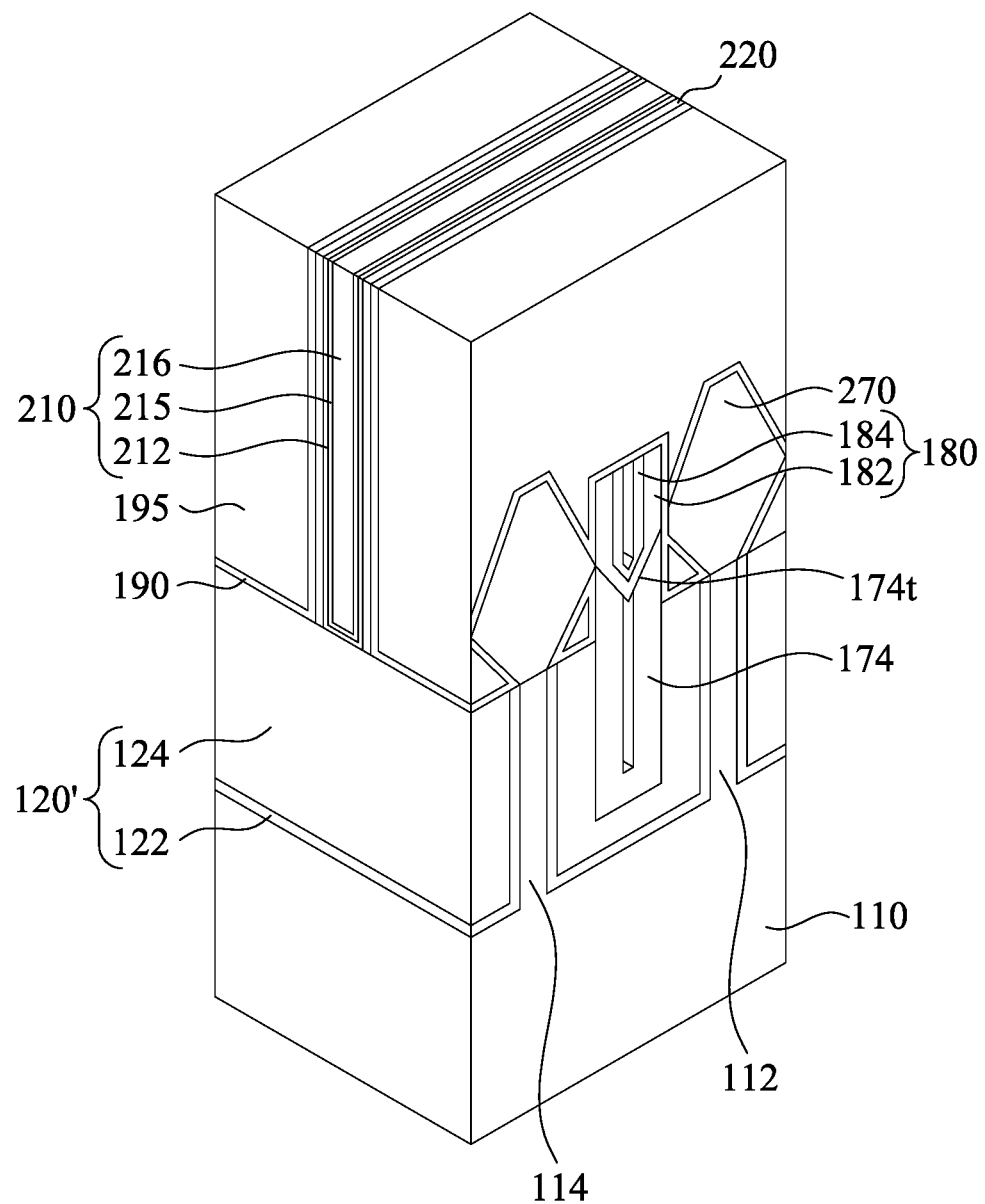

Returning to FIG. 1, the method M then proceeds to block S113 where a replacement gate (RPG) process scheme is employed. With reference to FIGS. 17 and 18, in some embodiments of block S113, subsequently and optionally, a replacement gate (RPG) process scheme is employed. In the RPG process scheme, a dummy polysilicon gate (the dummy gate structure 150 in FIG. 16 in this case) is formed in advance and is replaced later by a metal gate. In some embodiments, the dummy gate structure 150 is removed to form a gate trench 158 with the gate spacers 220 as its sidewalls. In some other embodiments, the sacrificial gate dielectric layer 140 (see FIG. 15) is removed as well. The dummy gate structure 150 (and the sacrificial gate dielectric layer 140) may be removed by dry etching, wet etching, or a combination of dry and wet etching.

A gate dielectric layer 212 is formed in the gate trench 158, and at least one metal layer is formed in the gate trench 158 and on the gate dielectric layer 212. Subsequently, a chemical mechanical planarization (CMP) process is performed to planarize the metal layer and the gate dielectric layer 212 to form a metal gate structure 210 in the gate trench 158. The metal gate structure 210 across the semiconductor fins 112 and 114. The metal gate structure 210 includes the gate dielectric layer 212 and a metal gate electrode 214 over the gate dielectric layer 212. The gate dielectric layer 212 extends along top surfaces of the first and second hard mask layers 182 and 184.

In some embodiments, the gate dielectric layer 212 includes a high-k material (k is greater than about 7) such as hafnium oxide ($HfO_2$), zirconium oxide ($ZrO_2$), lanthanum oxide ($La_2O_3$), hafnium aluminum oxide ($HfAlO_2$), hafnium silicon oxide ($HfSiO_2$), aluminum oxide ($Al_2O_3$), or other suitable materials. In some embodiments, the gate dielectric layer 212 may be formed by performing an ALD process or other suitable process. The metal gate electrode 214 may include metal layers 215, e.g., work function metal layer(s) and capping layer(s), a fill layer(s) 216, and/or other suitable layers that are desirable in a metal gate stack. The work function metal layer 215 may include an n-type and/or a p-type work function metal. Exemplary n-type work function metals include Ti, Ag, TaAl, TaAlC, TiAlN, TaC, TaCN, TaSiN, Mn, Zr, other suitable n-type work function materials, or combinations thereof. Exemplary p-type work function metals include TIN, TaN, Ru, Mo, Al, WN, $ZrSi_2$, $MoSi_2$, $TaSi_2$, $NiSi_2$, WN, other suitable p-type work function materials, or combinations thereof. The work function metal layer 215 may have multiple layers. The work function metal layer(s) 215 may be deposited by CVD, PVD, electroplating and/or other suitable processes. In some embodiments, the capping layer may include refractory metals and their nitrides (e.g., TiN, TaN, $W_2N$, TiSiN, and TaSiN). The capping layer may be deposited by PVD, CVD, metal-organic chemical vapor deposition (MOCVD) ALD, or the like. In some embodiments, the fill layer 216 may include tungsten (W). The fill layer 216 may be deposited by ALD, PVD, CVD, or another suitable process.

Figure 19:
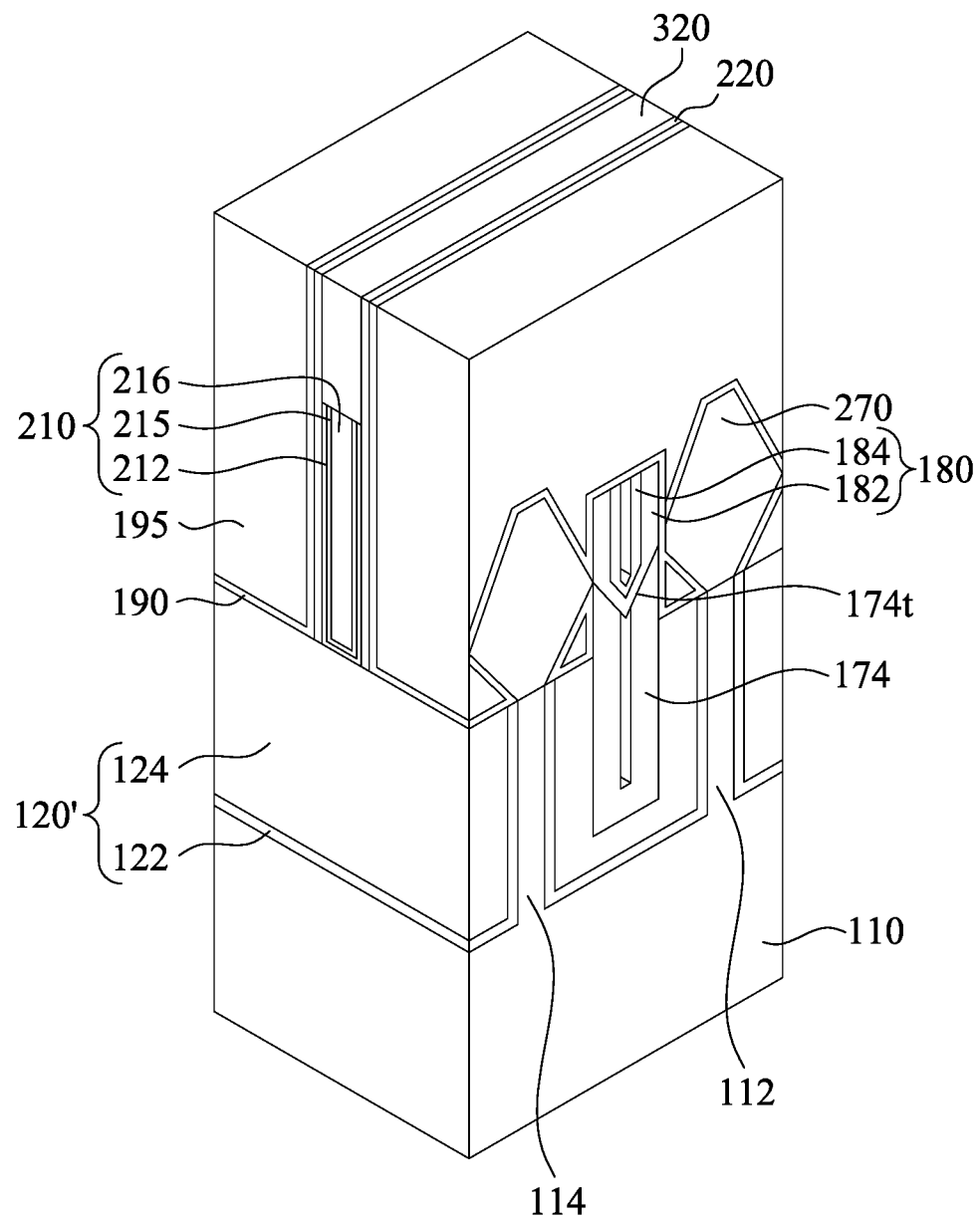

Returning to FIG. 1, the method M then proceeds to block S114 where a capping layer is formed to define self-aligned contact region. With reference to FIG. 19, in some embodiments of block S114, subsequently and optionally, the metal gate structure 210 is etched back to a predetermined level and form a gate trench thereon. As such, a portion of the hard mask structure 180 protrudes from the metal gate structure 210 while the hard mask structure 180 is embedded in the metal gate structure 210. Then, a capping layer 320 is formed over the etched metal gate structure 210 using, for example, a deposition process to deposit a dielectric material over the substrate 110, followed by a CMP process to remove excess dielectric material outside the gate trenches. In some embodiments, the capping layer 320 includes silicon nitride, silicon oxide, silicon oxynitride, SiCN, SiCON, SiOC, or other suitable dielectric material. By way of example, if the capping layer 320 is SiN, the gate spacers 220 and/or the ILD 195 are dielectric materials different from SiN. The capping layer 320 can be used to define self-aligned contact region and thus referred to as SAC structures or a SAC layer. The capping layer 320 is in contact with the gate dielectric layer 212, the metal layer 215, and the fill layer 216, and a portion of the hard mask structure 180 is embedded in the capping layer 320.

Figure 20A:
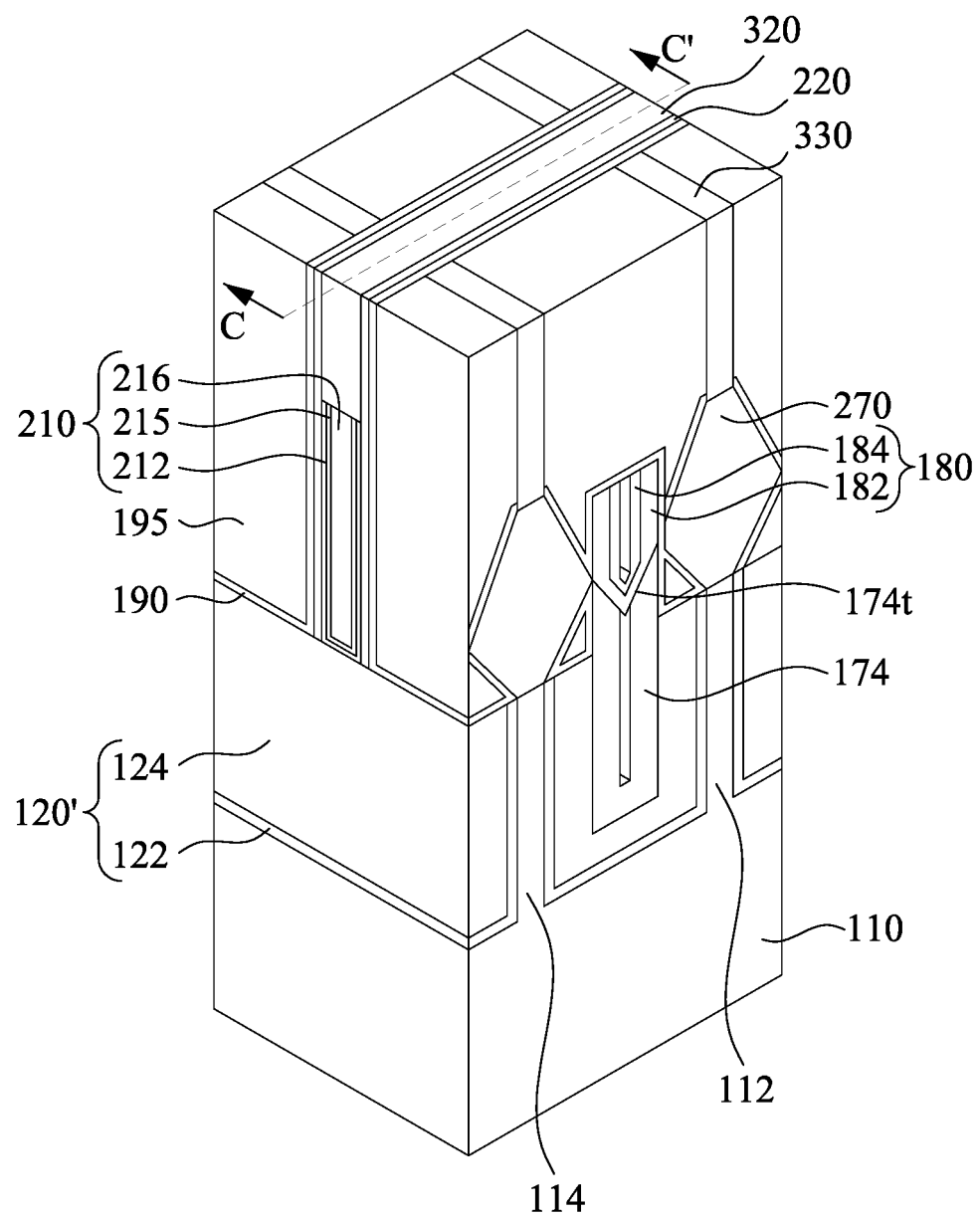
Figure 20B:
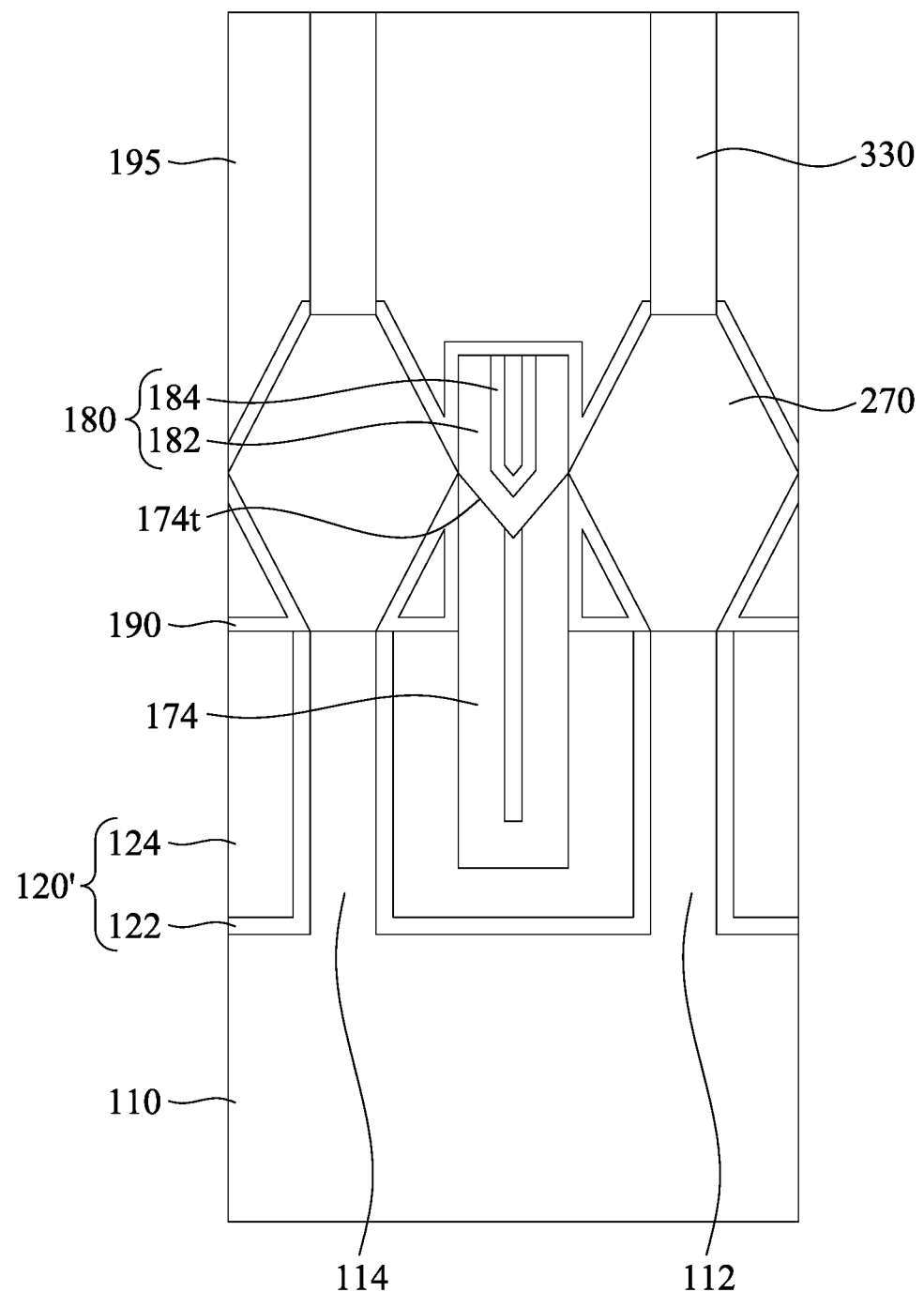
Figure 20C:
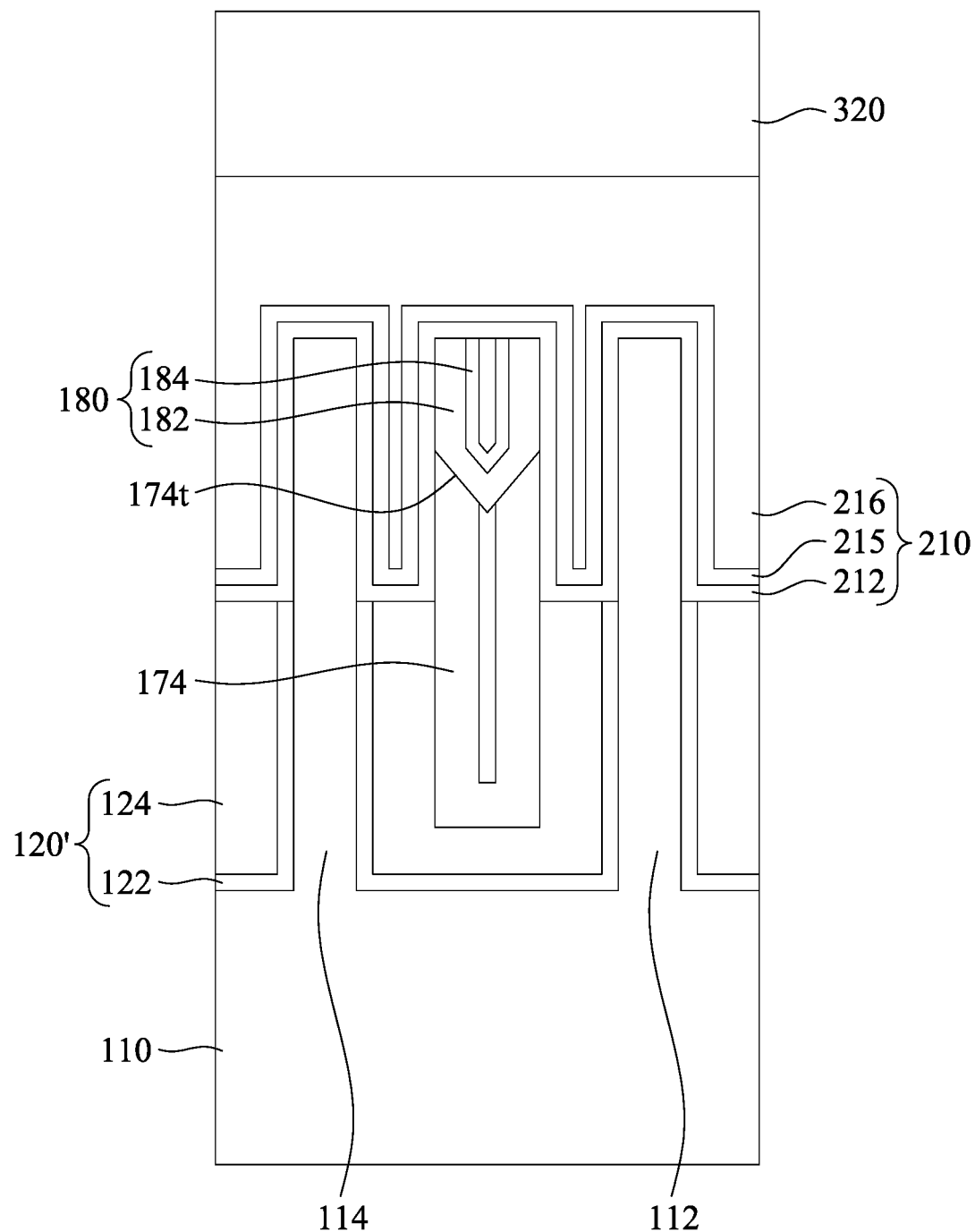
FIG. 20C is a cross-sectional view taken along line C-C in FIG. 20A.

Returning to FIG. 1, the method M then proceeds to block S115 where contacts are formed to land on the epitaxial structures. With reference to FIGS. 20A, 20B, and 20C, in some embodiments of block S115, the ILD 195 is patterned to form trenches on opposite sides of the gate structure 210 and the capping layer 320, and then the CESL 190 is patterned to expose the epitaxial structures 270. In some embodiments, multiple etching processes are performed to pattern the ILD 195 and the CESL 190. The etching processes include dry etching process, wet etching process, or combinations thereof. Then, contacts 330 are formed in the trenches. As such, the contacts 330 are respectively in contact with the epitaxial structures 270. In some embodiments, the contacts 330 may be made of metal, such as W, Co, Ru, Al, Cu, or other suitable materials. After the deposition of the contacts 330, a planarization process, such as a chemical mechanical planarization (CMP) process, may be then performed. As such, a top surface of the contacts 330 and a top surface of the ILD 195 are substantially coplanar. In some embodiments, metal alloy layers (such as silicide) may be formed between the contacts 330 and the epitaxial structures 270. Further, barrier layers may be formed in the trenches before the formation of the contacts 330. The barrier layers may be made of TiN, TaN, or combinations thereof.

According to the aforementioned embodiments, it can be seen that the present disclosure offers advantages in fabricating semiconductor devices. It is understood, however, that other embodiments may offer additional advantages, and not all advantages are necessarily disclosed herein. The hard mask structure of the present disclosure is formed over the dummy fin structure and has a higher etching resistance than the semiconductor fins. Thus, the hard mask structure can be used to prevent damage to the dummy fin structure therebelow by subsequent processing (e.g., subsequent etching the semiconductor fins to form the epitaxial structures on the etched semiconductor fins). The hard mask structure includes a crystalline hard mask layer formed over the dummy fin structure and an amorphous hard mask layer formed in the hard mask layer. An advantage of the present disclosure is that the amorphous hard mask layer is used to limit the profile distortion of the crystalline hard mask layer during crystallization to avoid the formation of voids inside the hard mask structure, and thereby improving electrical performance of the semiconductor device.

In some embodiments, a semiconductor device includes a substrate, a pair of semiconductor fins, a dummy fin structure, a shallow trench isolation (STI) structure, a gate structure, a plurality of source/drain structures, a crystalline hard mask layer, and an amorphous hard mask layer. The pair of semiconductor fins extend upwardly from the substrate. The dummy fin structure extends upwardly above the substrate and is laterally between the pair of semiconductor fins. The STI structure laterally surrounds lower portions of the pair of semiconductor fins and the dummy fin structure. The gate structure extends across the pair of semiconductor fins and the dummy fin structure. The source/drain structures are above the pair of semiconductor fins and on either side of the gate structure. The crystalline hard mask layer extends upwardly from the dummy fin and has an U-shaped cross section. The amorphous hard mask layer is in the first hard mask layer, wherein the amorphous hard mask layer having an U-shaped cross section conformal to the U-shaped cross section of the crystalline hard mask layer. In some embodiments, the amorphous hard mask layer is doped with a dopant and the crystalline hard mask layer is free of the dopant. In some embodiments, the dopant comprises silicon. In some embodiments, the dopant comprises aluminum. In some embodiments, the crystalline hard mask layer and the amorphous hard mask layer include a same high-k dielectric material. In some embodiments, the crystalline hard mask layer and the amorphous hard mask layer include a same metal oxide-containing material. In some embodiments, the crystalline hard mask layer is made of $HfO_2$ and the amorphous hard mask layer is made of silicon-doped $HfO_2$. In some embodiments, the crystalline hard mask layer is made of $ZrO_2$ and the amorphous hard mask layer is made of silicon-doped $ZrO_2$. In some embodiments, the crystalline hard mask layer and the amorphous hard mask layer are made of a material different than the dummy fin structure. In some embodiments, the amorphous hard mask layer has a thinner thickness than the crystalline hard mask layer.

In some embodiments, a semiconductor device includes a substrate, a pair of semiconductor fins, a dummy fin structure, a gate structure, a plurality of source/drain structures, a metal oxide layer, and a metal silicate layer. The pair of semiconductor fins extend upwardly from the substrate. The dummy fin structure extends upwardly above the substrate and is laterally between the pair of semiconductor fins. The gate structure extends across the pair of semiconductor fins and the dummy fin structure. The source/drain structures are above the pair of semiconductor fins and on either side of the gate structure. The silicon-free metal oxide layer extends upwardly from the dummy fin. The silicon-doped metal oxide layer is over the dummy fin and laterally surrounded by the silicon-free metal oxide layer. In some embodiments, the silicon-free metal oxide layer is in a crystalline state and the silicon-doped metal oxide layer is in an amorphous state. In some embodiments, the silicon-doped metal oxide layer has a silicon atomic percentage content of greater than about 10%. In some embodiments, the silicon-free metal oxide layer has an U-shaped cross section and the silicon-doped metal oxide layer having an U-shaped cross section conformal to the U-shaped cross section of the silicon-free metal oxide layer. In some embodiments, the silicon-doped metal oxide layer has a thinner thickness than the silicon-free metal oxide layer. In some embodiments, the gate structure comprises a high-k dielectric layer extending across and in contact with the silicon-free metal oxide layer and the silicon-doped metal oxide layer. In some embodiments, the semiconductor device further includes a contact etch stop layer over the plurality of source/drain structures and in contact with the silicon-free metal oxide layer and the silicon-doped metal oxide layer.

In some embodiments, a method for forming a semiconductor device, includes: forming a pair of semiconductor fins extending upwardly from the substrate to have a trench therebetween; forming a dummy fin structure in the trench between the pair of semiconductor fins; depositing a metal oxide layer over the dummy fin structure in the trench at a first temperature lower than a first crystallization temperature of the metal oxide layer; depositing a silicon-containing metal oxide layer over the metal oxide layer in the trench at a second temperature lower than the first crystallization temperature of the metal oxide layer; performing a planarization process on the metal oxide layer and the silicon-containing metal oxide layer to expose the pair of semiconductor fins; annealing the metal oxide layer at a third temperature higher than the first crystallization temperature of the metal oxide layer and lower than a second crystallization temperature of the silicon-containing metal oxide layer; forming a gate structure extending across the pair of semiconductor fins; and forming a plurality of source/drain structures above the pair of semiconductor fins and on either side of the gate structure. In some embodiments, the metal oxide layer and the silicon-containing metal oxide layer are in-situ deposited. In some embodiments, the silicon-containing metal oxide layer has a thinner thickness than the metal oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a substrate;
a pair of semiconductor fins extending upwardly from the substrate;
a dummy fin structure extending upwardly above the substrate and laterally between the pair of semiconductor fins;
a shallow trench isolation (STI) structure laterally surrounding lower portions of the pair of semiconductor fins and the dummy fin structure;
a gate structure extending across the pair of semiconductor fins and the dummy fin structure;
a plurality of source/drain structures above the pair of semiconductor fins and on either side of the gate structure;
a crystalline hard mask layer extending upwardly from the dummy fin structure and having a U-shaped cross section; and
an amorphous hard mask layer in the crystalline hard mask layer, wherein the amorphous hard mask layer having a U-shaped cross section conformal to the U-shaped cross section of the crystalline hard mask layer.

2. The semiconductor device of claim 1, wherein the amorphous hard mask layer is doped with a dopant and the crystalline hard mask layer is free of the dopant.

3. The semiconductor device of claim 2, wherein the dopant comprises silicon.

4. The semiconductor device of claim 2, wherein the dopant comprises aluminum.

5. The semiconductor device of claim 1, wherein the crystalline hard mask layer and the amorphous hard mask layer include a same high-k dielectric material.

6. The semiconductor device of claim 1, wherein the crystalline hard mask layer and the amorphous hard mask layer include a same metal oxide-containing material.

7. The semiconductor device of claim 1, wherein the crystalline hard mask layer is made of $HfO_2$ and the amorphous hard mask layer is made of silicon-doped $HfO_2$.

8. The semiconductor device of claim 1, wherein the crystalline hard mask layer is made of $ZrO_2$ and the amorphous hard mask layer is made of silicon-doped $ZrO_2$.

9. The semiconductor device of claim 1, wherein the crystalline hard mask layer and the amorphous hard mask layer are made of a material different than the dummy fin structure.

10. The semiconductor device of claim 1, wherein the amorphous hard mask layer has a thinner thickness than the crystalline hard mask layer.

11. A semiconductor device, comprising:
a substrate;
a pair of semiconductor fins extending upwardly from the substrate;
a dummy fin structure extending upwardly above the substrate and laterally between the pair of semiconductor fins;
a gate structure extending across the pair of semiconductor fins and the dummy fin structure;

a plurality of source/drain structures above the pair of semiconductor fins and on either side of the gate structure;

a silicon-free metal oxide layer extending upwardly from the dummy fin structure; and a silicon-doped metal oxide layer over the dummy fin structure and laterally surrounded by the silicon-free metal oxide layer, wherein the silicon-free metal oxide layer is in a crystalline state and the silicon-doped metal oxide layer is in an amorphous state.

12. The semiconductor device of claim 11, wherein the silicon-free metal oxide layer is made of $HfO_2$ and the silicon-doped metal oxide layer is made of silicon-doped $HfO_2$.

13. The semiconductor device of claim 11, wherein the silicon-doped metal oxide layer has a silicon atomic percentage content of greater than about 10%.

14. The semiconductor device of claim 11, wherein the silicon-free metal oxide layer has a U-shaped cross section and the silicon-doped metal oxide layer having a U-shaped cross section conformal to the U-shaped cross section of the silicon-free metal oxide layer.

15. The semiconductor device of claim 11, wherein the silicon-doped metal oxide layer has a thinner thickness than the silicon-free metal oxide layer.

16. The semiconductor device of claim 11, wherein the gate structure comprises a high-k dielectric layer extending across and in contact with the silicon-free metal oxide layer and the silicon-doped metal oxide layer.

17. The semiconductor device of claim 11, further comprising a contact etch stop layer over the plurality of source/drain structures and in contact with the silicon-free metal oxide layer and the silicon-doped metal oxide layer.

18. A semiconductor device, comprising:

a first channel region over a substrate;

a second channel region over the substrate;

a dummy fin extending upwardly above the substrate and laterally between the first and second channel regions;

a gate structure extending across the first and second channel regions and the dummy fin;

a plurality of first source/drain structures on the first channel region;

a plurality of second source/drain structures on the second channel region;

a crystalline hard mask layer extending upwardly from the dummy fin; and an amorphous hard mask layer laterally surrounded by the crystalline hard mask layer.

19. The semiconductor device of claim 18, wherein the amorphous hard mask layer is doped with a dopant and the crystalline hard mask layer is free of the dopant.

20. The semiconductor device of claim 18, wherein the crystalline hard mask layer and the amorphous hard mask layer comprises a same high-k dielectric material.

* * * * *